(12) United States Patent
Hwang et al.

(10) Patent No.: US 6,822,703 B2
(45) Date of Patent: Nov. 23, 2004

(54) POLYCRYSTALLINE SILICON THIN FILM TRANSISTOR OF LIQUID CRYSTAL DISPLAY AND MANUFACTURING METHOD THEREOF

(75) Inventors: Chang-Won Hwang, Yongin-si (KR); Woo-Suk Chung, Anyang-si (KR); Tae-Hyeong Park, Seoul (KR); Hyun-Jae Kim, Seongam-si (KR); Gyu-Sun Moon, Suwon-si (KR); Sook-Young Kang, Susung-gu (KR)

(73) Assignee: Samsung Electronics Co., LTD, Suwon (KR)

( * ) Notice: Subject to any disclaimer, the term of this patent is extended or adjusted under 35 U.S.C. 154(b) by 46 days.

(21) Appl. No.: 10/128,330

(22) Filed: Apr. 24, 2002

(65) Prior Publication Data

US 2002/0158995 A1 Oct. 31, 2002

(30) Foreign Application Priority Data

Apr. 26, 2001 (KR) .......................................... 2001-22536
Jul. 23, 2001 (KR) .......................................... 2001-44295

(51) Int. Cl.⁷ ....................... G02F 1/136; G02F 1/1343; G02F 1/1333; H01L 29/04
(52) U.S. Cl. ........................... 349/43; 349/39; 349/138; 257/59; 257/72
(58) Field of Search ............................ 349/39, 42–44, 349/110, 138, 187; 257/59, 72

(56) References Cited

U.S. PATENT DOCUMENTS

| | | | | |
|---|---|---|---|---|
| 5,412,493 A | * | 5/1995 | Kunii et al. | 349/43 |
| 5,604,358 A | * | 2/1997 | Kim | 257/59 |
| 5,717,224 A | * | 2/1998 | Zhang | 257/57 |
| 5,726,461 A | * | 3/1998 | Shimada et al. | 257/57 |
| 6,137,551 A | * | 10/2000 | Jeong | 349/38 |
| 6,160,269 A | * | 12/2000 | Takemura et al. | 257/59 |

* cited by examiner

Primary Examiner—Tarifur R. Chowdhury
(74) Attorney, Agent, or Firm—MuGuireWoods, LLP

(57) ABSTRACT

A polycrystalline silicon TFT for an LCD and a manufacturing method thereof is disclosed. The TFT comprises an active pattern formed on a substrate, a gate insulating layer formed on the substrate including the active pattern, a gate line formed on the gate insulating layer to be crossed with the active pattern and including a gate electrode for defining the first impurity region, a second impurity region and a channel region, an insulating interlayer formed on the gate insulating layer including the gate line, a data line formed on the insulating interlayer and connected to the second impurity region through the first contact hole which is formed through the gate insulating layer and the insulating interlayer on the second impurity region and a pixel electrode formed on the same insulating interlayer as the data line and connected with the first impurity region through a second contact hole which is formed through the gate insulating layer and the insulating interlayer on the first impurity region. The number of mask can be reduced to 5 or 6 sheets, thereby simplifying a manufacturing process.

33 Claims, 28 Drawing Sheets

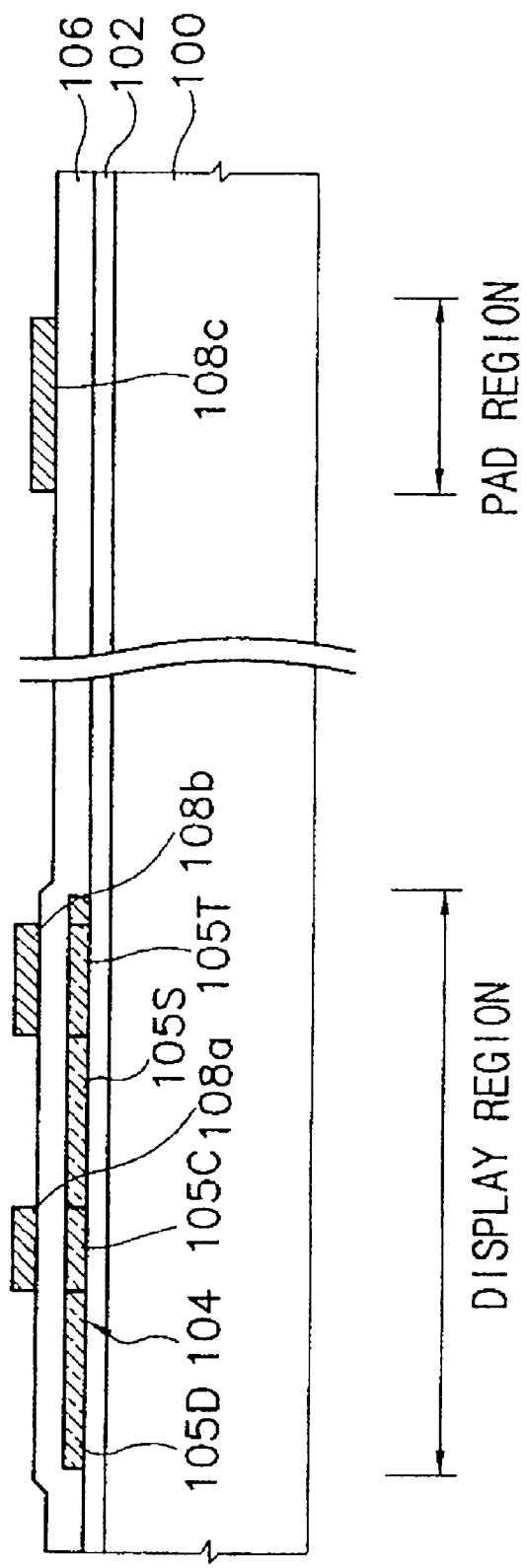

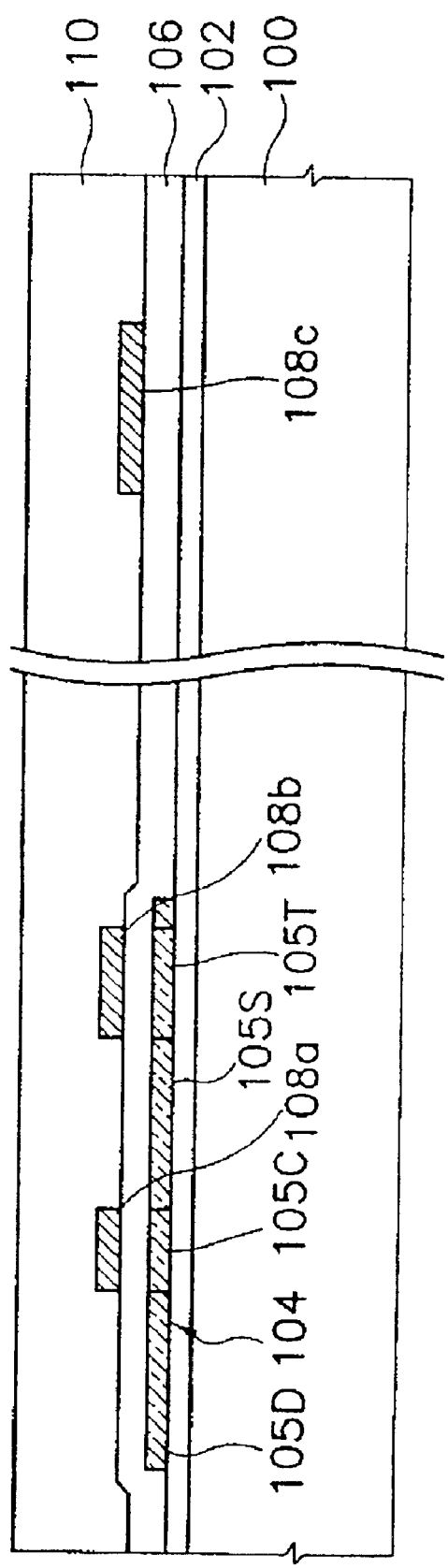

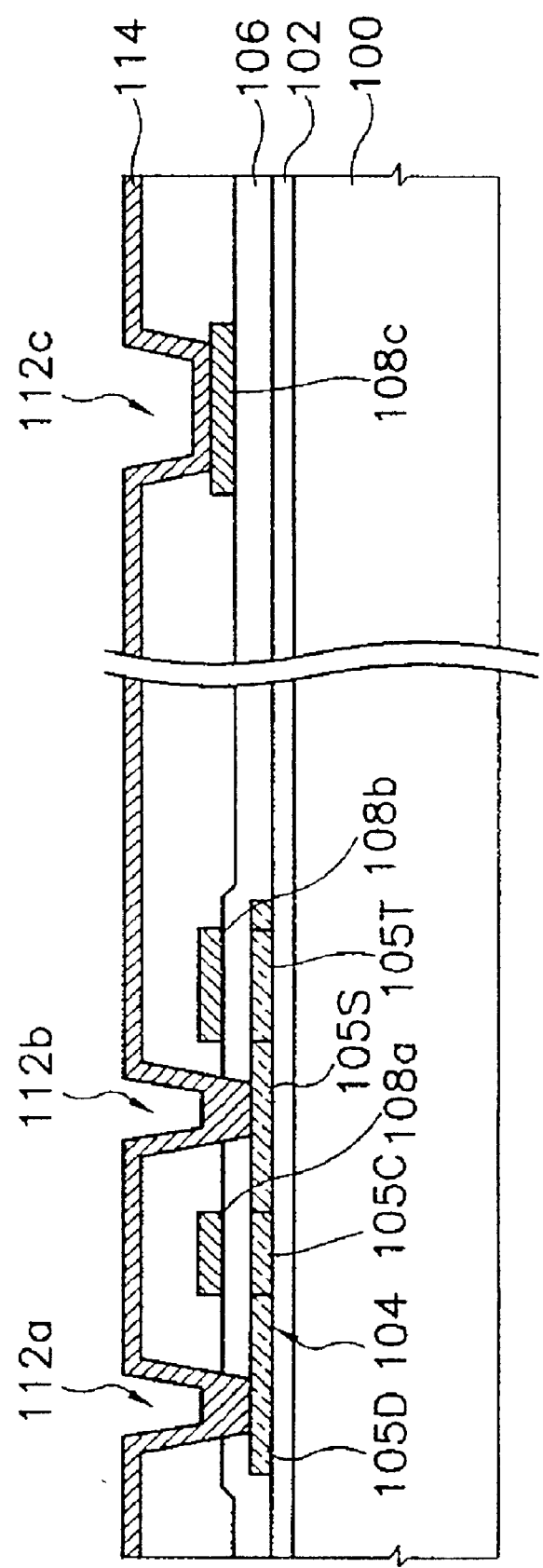

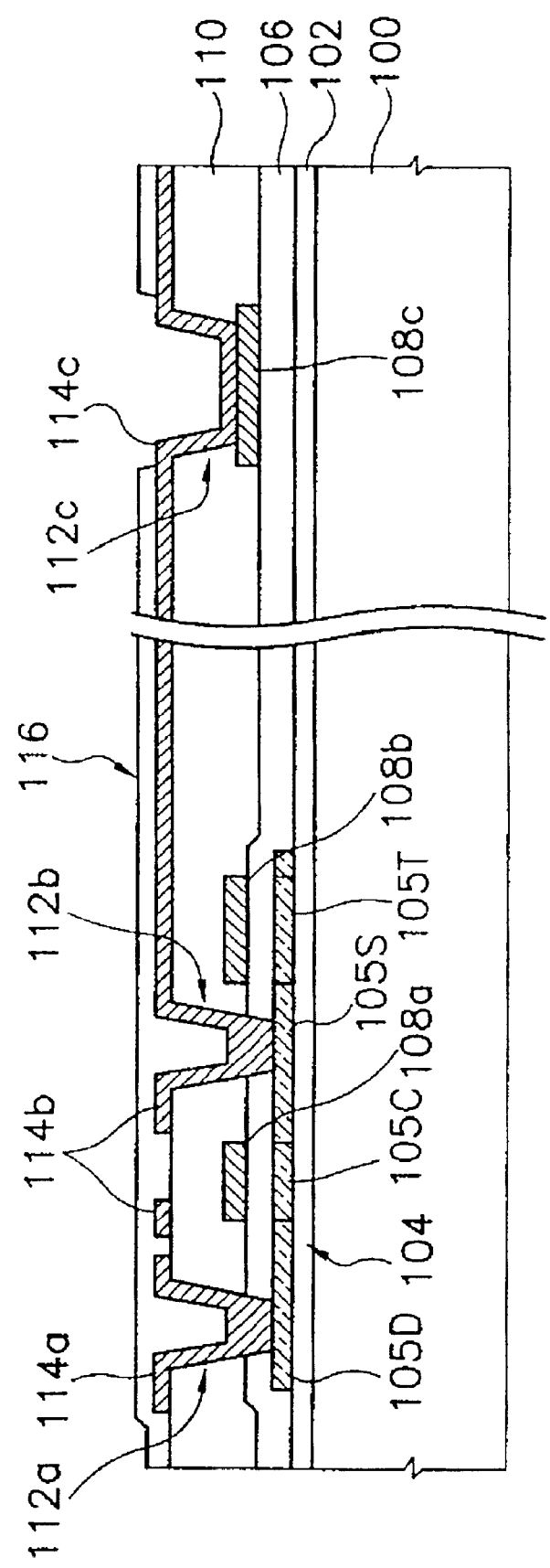

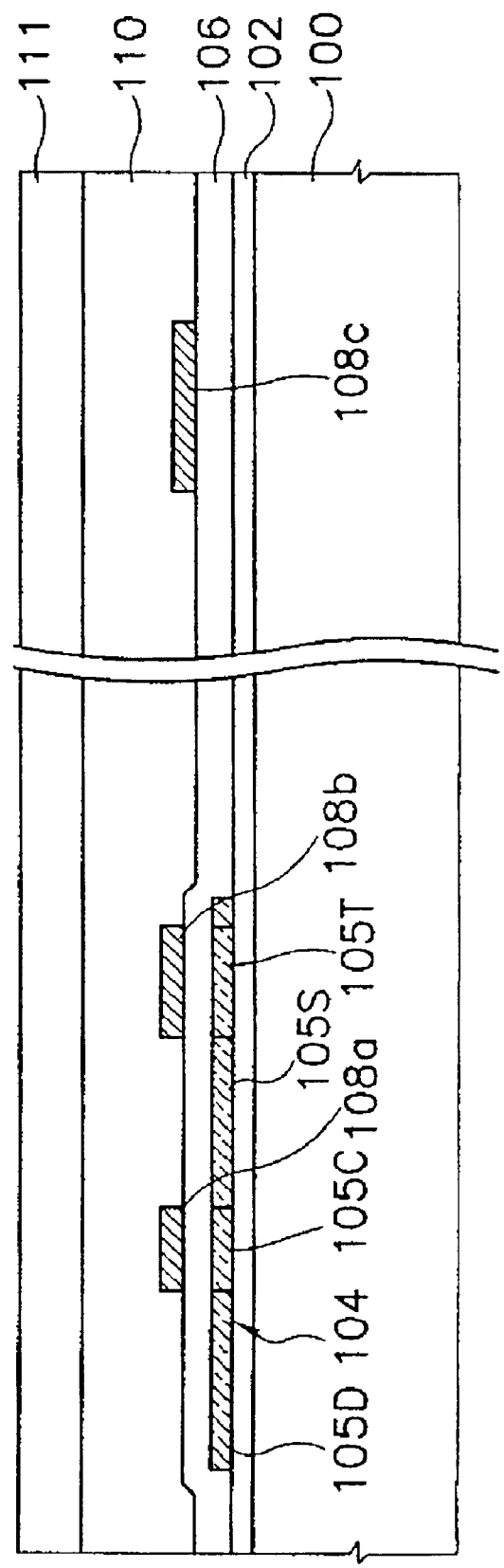

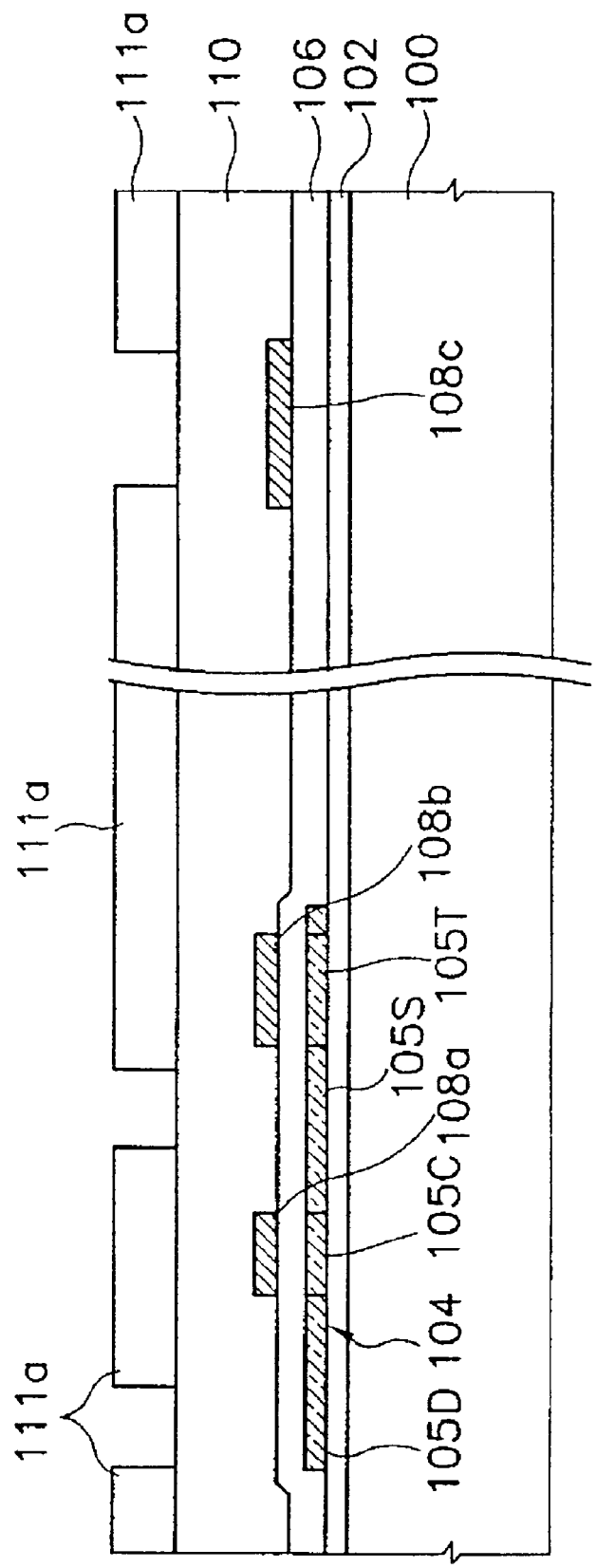

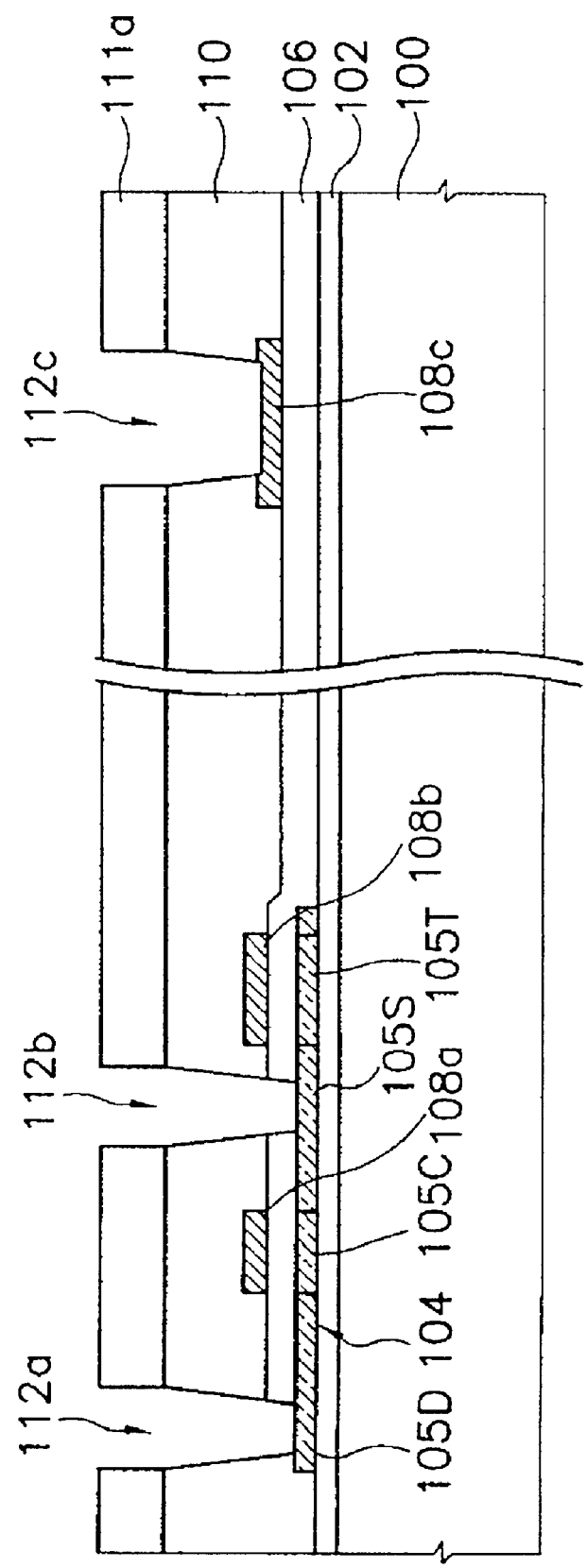

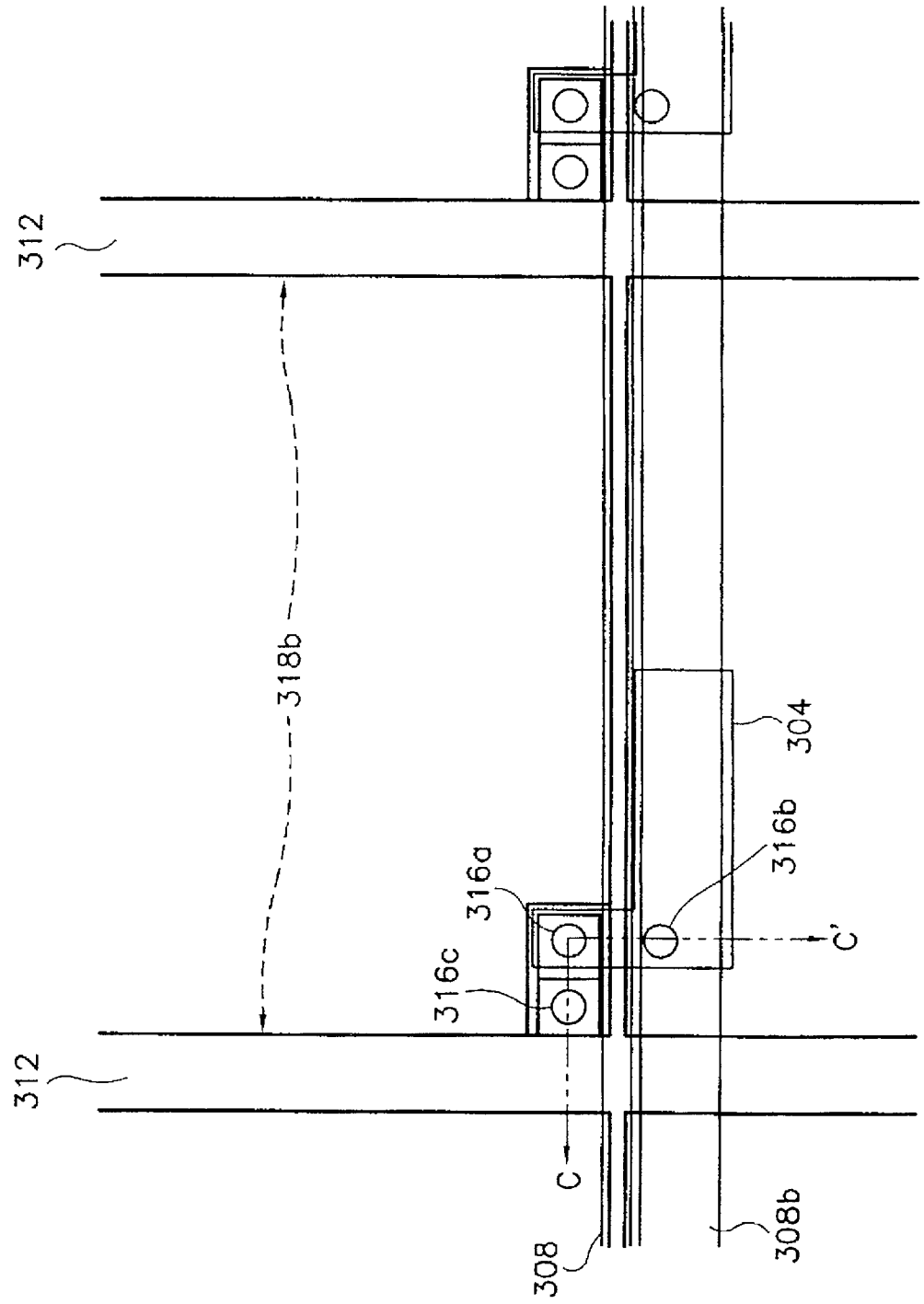

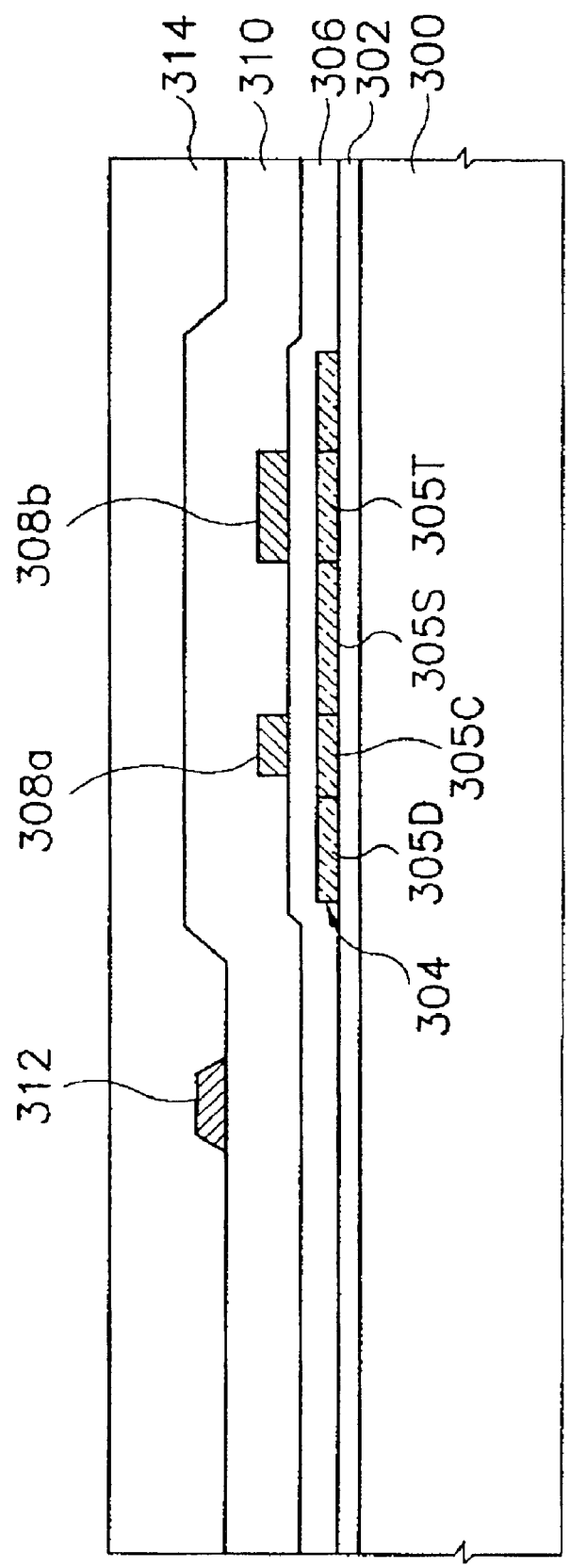

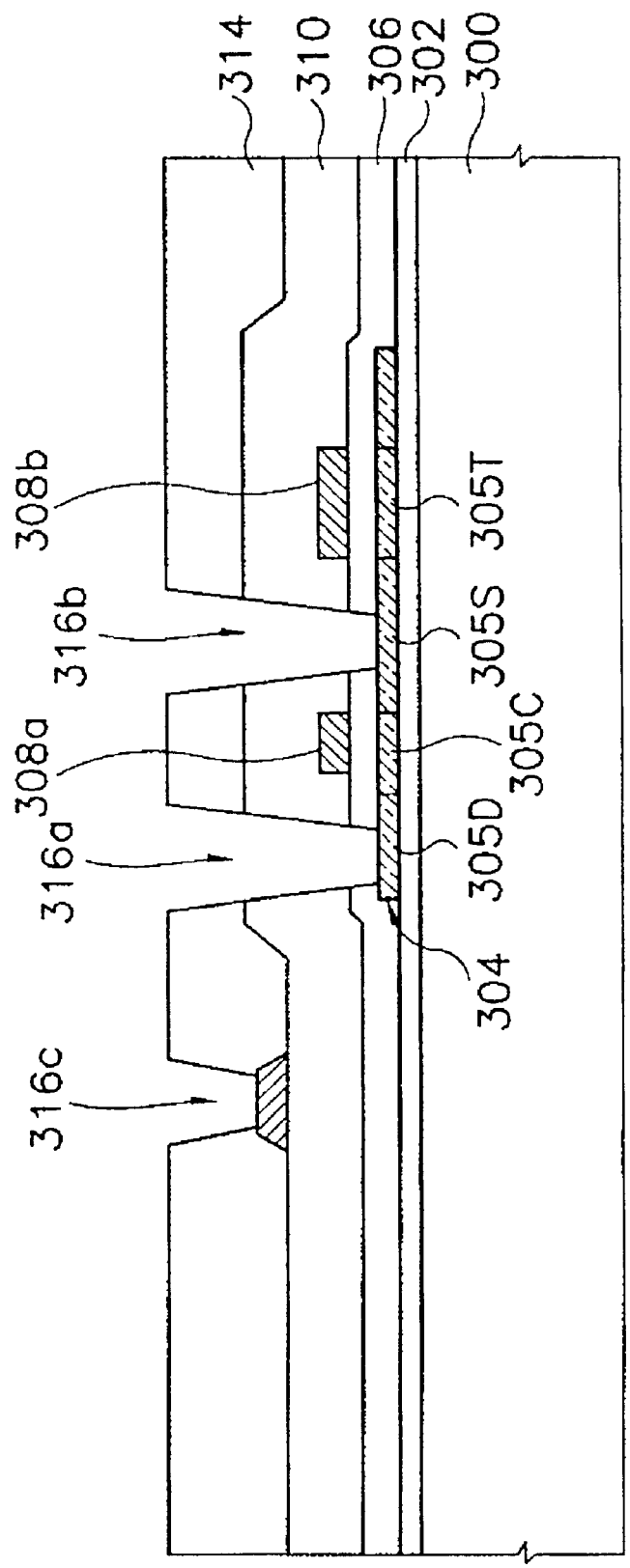

POLYCRYSTALLINE SILICON THIN FILM TRANSISTOR OF LIQUID CRYSTAL DISPLAY AND MANUFACTURING METHOD THEREOF

BACKGROUND OF THE INVENTION

1. Field of the Invention

The present invention relates to a TFT (thin film transistor) and a manufacturing method thereof and, more particularly, to a polycrystalline silicon thin film transistor for an LCD (liquid crystal display), which has both p-type and n-type transistors to form a CMOS (complementary metal-oxide semiconductor) structure for a driving circuit, and a method of manufacturing the same.

2. Description of the Related Art

In an information-oriented society these days, the importance of electronic display devices is well recognized, and the electronic displays of all kinds are widely used in various industrial fields.

Generally, an electronic display is an apparatus for visually transmitting information to a person, which means that an electrical information signal output from various electronic devices is converted into a visually recognizable optical information signal at the electronic display. Therefore, the electronic display serves as a media for connecting the person and the electronic devices.

The electronic display is generally divided into an emissive type display and a non-emissive type display. In the emissive type display, an optical information signal is displayed by using a light-emitting technique. In the non-emissive type display, an optical information signal is displayed by using an optical modulation technique such as light-reflecting, dispersing and interfering phenomenon, etc. The emissive type display is also called an active display, which includes a CRT (Cathode Ray Tube), a PDP (Plasma Display Panel), an LED (Light Emitting Diode) and an ELD (Eelectroluminescesnt Display), etc. The non-emissive display is also called a passive display, which includes an LCD (Liquid Crystal Display), an ECD (Electrochemical Display) and an EPID (Electrophoretic Image Display), etc.

The CRT is used in the image display devices such as television receivers and monitors, etc. The CRT has the highest market share mainly due to its satisfactory displaying quality and economical efficiency, but also has many disadvantages such as heavy weight, large volume and high power consumption.

Meanwhile, due to the recent rapid development of the semiconductor technology, various kinds of new electronic devices have been introduced, which they are driven by lower voltage, consume less power, and are much slimmer and lighter. This development eventually brought a new type display device, such as a flat panel type display, which is slimmer and lighter than the CRT, and driven by the lower driving voltage with lower power consumption. Among the various new flat panel type display, the LCD is much slimmer and lighter than any other displays and has the lower driving voltage and the lower power consumption while providing the displaying quality similar to that of the CRT. Therefore, the LCD is widely used in various electronic display devices.

The LCD comprises two substrates, each having an electrode, and a liquid crystal layer interposed therebetween. In the LCD, a voltage is applied to the electrodes to realign liquid crystal molecules and control an amount of light transmitted through the molecules. One of the LCDs, which is mainly used nowadays, is provided with the electrode formed at each of the two substrates and a thin film transistor for switching power supplied to each electrode. Generally, the thin film transistor (referred to as TFT, hereinafter) is formed within a pixel portion at one side of the two substrates.

The LCDs employing TFTs are divided into an amorphous type TFT-LCD and a polycrystalline type TFT-LCD. The polycrystalline type TFT-LCD has an advantage that the LCD can be driven at a high speed with low power consumption. Also, the TFT in the pixel portion can be simultaneously formed together with a semiconductor device for a drive circuit. Further, the drive circuit of the LCD normally has a CMOS (complementary metal-oxide semiconductor) structure, in which a complementary operation is achieved between different conductive types of transistors, to increase circuit performance.

However, since both an n-channel transistor and a p-channel transistor are formed together on the same substrate, a process of manufacturing the polycrystalline TFT-LCD is very complicated and difficult, as compared to the manufacturing process of the amorphous type TFT-LCD, in which a single conductivity type transistor is formed. Typically, the TFT within an LCD is formed on the substrate by a photolithography process using a mask. At the present, seven to nine sheets of mask are used for manufacturing the amorphous type TFT-LCD.

FIGS. 1A and 1B depict the cross-sectional views of a pixel portion of a substrate where a TFT is formed thereon in order to show a conventional method of manufacturing a polycrystalline TFT having a top-gate structure using seven sheets of mask.

Referring to FIG. 1A, a blocking layer 12 is formed on an entire surface of a transparent substrate 10, which is glass, quartz or sapphire. The blocking layer prevents the impurity in the substrate 10 from penetrating into a silicon layer during crystallization of an amorphous silicon layer in the subsequent process.

After depositing the amorphous silicon layer on the blocking layer 12, the amorphous silicon layer is converted into a polycrystalline silicon layer by laser or furnace annealing. Then, the polycrystalline silicon layer is patterned using a photolithography process to form an active pattern 14 using the first mask (not shown).

A gate insulating layer 16 is deposited on the active pattern 14 and the blocking layer 12. A gate conductive layer is formed over the gate insulating film 16. The gate conductive layer formed in a p-type TFT region is etched using the photolithography process to form a gate electrode (not shown) of a p-type TFT using the second mask (not shown). Then, p-type impurities are ion-implanted to form source and drain regions 15S, 15D. The gate conductive layer in an n-type TFT region is etched using the photolithography process to form a gate electrode 18 of an n-type TFT (using the third mask). N-type impurity is ion-implanted to form the source/drain region 15S, 15D. In the ion-implanting process, the gate electrode 18 blocks the impurity ion to be implanted into the underlying active pattern 14, thereby allowing a channel region 15C to be defined at the active pattern 14. Here, the process order of forming the p-type TFT, and the gate and the source/drain of the n-type TFT may be changed.

Sequentially, in order to activate the doped ions and secure the damage of the semiconductor layer, the annealing process is performed using a laser beam, etc. On the gate electrode 18 and the gate insulating layer 16, there is formed an insulating interlayer 20 made of an organic insulating material or an inorganic insulating material such as SiO2 and SiNx. The insulating interlayer 20 is partially etched by the photolithography process to form the first contact hole 22a for exposing the source region 15S and the second contact hole 22b for exposing the drain region 15D of the active pattern 14 (using the fourth mask).

On the first and second contact holes 22a, 22b and the insulating interlayer 20 is deposited a metal layer. The metal layer is patterned using the photolithography process to thereby form a source/drain electrode 26a, 26b and a data line 16c (using the fifth mask).

Referring to FIG. 1B, on the source/drain electrode 26a, 26b, the data line 26c and the insulating interlayer 20, there is formed a passivation layer 28 made of the organic insulating material and the inorganic insulating layer. The passivation layer 28 is partially etched by the photolithography process to form a via hole 30 for exposing the source electrode 26a (using the sixth mask).

Then, after a transparent conductive layer or a reflective conductive layer is deposited on the via hole 30 and the passivation layer 28, the conductive layer is patterned by the photolithography process to form a pixel electrode 32 which is connected through the via hole 30 to the source electrode 26a (using a seventh mask).

According to the conventional TFT-LCD, in order to fabricate the top-gate structure, the photolithography process is needed for patterning the seven layers of the active pattern, the gate electrode of the p-type TFT, the gate electrode of the n-type TFT, the contact hole, the data line, the via hole and the pixel electrode. Therefore, seven masks in total are necessary.

The more the number of photolithography process increases, the more the manufacturing cost and the probability of process error increase. Since the production cost of the polycrystalline TFT also increases, a technique for reducing the number of mask is necessary.

SUMMARY OF THE INVENTION

Therefore, it is the first object of the present invention to provide a polycrystalline TFT for an LCD in which various layers made of the same material are formed on the same layer to reduce the number of mask.

It is the second object of the present invention to provide a method of manufacturing a polycrystalline TFT for an LCD, in which various layers made of the same material are formed on the same layer to reduce the number of mask.

It is the third object of the present invention to provide a polycrystalline TFT for an LCD in which a contact hole and a via hole are formed at the same time to reduce the number of mask.

It is the fourth object of the present invention to provide a method of manufacturing a polycrystalline TFT for an LCD, in which a contact hole and a via hole are formed at the same time to reduce the number of mask.

To achieve the first objects of the present invention, there is provided a polycrystalline silicon TFT for an LCD. The TFT includes an active pattern formed on a substrate. A gate insulating layer is formed on the substrate including the active pattern. A gate line is formed on the gate insulating layer to cross the active pattern and includes a gate electrode for defining the first impurity region, the second impurity region and a channel region of the active pattern. An insulating interlayer is formed on the gate insulating layer including the gate line. A data line is formed on the insulating interlayer and is connected to the second impurity region through the first contact hole which is formed through the gate insulating layer and the insulating interlayer on the second impurity region. A pixel electrode is formed on the insulating interlayer by patterning a same conductive layer as the data line and is connected with the first impurity region through the second contact hole which is formed through the gate insulating layer and the insulating interlayer on the first impurity region.

To achieve the second object of the present invention, there is provided a method of manufacturing a polycrystalline silicon TFT for an LCD. In the above method, an active pattern is formed on a substrate and then a gate insulating layer is formed on the substrate including the active pattern. Then, a gate layer is formed on the gate insulating layer and then the gate layer is patterned to form a gate line. An ion-implanting process is performed to form the first impurity region and the second impurity region at the active pattern. An insulating interlayer is formed on the insulating layer and on the gate line. The insulating interlayer and the gate insulating layer are partially etched to form the first contact hole for exposing the second impurity region and the second contact hole for exposing the first impurity region. A conductive layer is formed on the insulating interlayer including the first and second contact holes and then the conductive layer is patterned to form a data line which is connected through the first contact hole to the second impurity region and a pixel electrode which is connected through the second contact hole to the first impurity region.

To achieve the third object of the present invention, there is provided a polycrystalline silicon TFT for an LCD. The TFT has an active pattern formed on a substrate. A gate insulating layer is formed on the substrate including the active pattern. A gate line is formed on the gate insulating layer to cross the active pattern and includes a gate electrode for defining the first impurity region, the second impurity region and a channel region of the active pattern. The first insulating interlayer is formed on the gate insulating layer and on the gate line. A data line is formed on the first insulating interlayer and the second insulating interlayer formed on the first insulating interlayer and on the data line. A pixel electrode is formed at the second insulating interlayer and is connected with the first impurity region through the second contact hole which is formed through the gate insulating layer, the first insulating interlayer and the second insulating interlayer on the first impurity region. An electrode is formed on the second insulating layer by patterning a same conductive layer as the pixel electrode. The electrode connects the data line and the second impurity region through the first contact hole which is formed through the gate insulating layer and the first and second insulating interlayers on the second impurity region and the third contact hole which is formed at the second insulating interlayer on the data line.

To achieve the fourth object of the present invention, there is provided a method of manufacturing a polycrystalline silicon TFT for an LCD which comprises the steps as follows:

An active pattern is formed on a substrate and a gate insulating layer is formed on the substrate including the active pattern. A gate layer is formed on the gate insulating layer and then patterned to form a gate line. An ion-implanting process is performed to form the first impurity region and the second impurity region of the active pattern. The first insulating interlayer is formed on the insulating layer including the gate line and then a data line is formed on the first insulating interlayer. The second insulating interlayer is formed on the first insulating interlayer and on the data line. The second insulating interlayer, the first insulating interlayer or the gate insulating layer are partially etched to form the first contact hole for exposing the second impurity region, the second contact hole for exposing the first impurity region and the third contact hole for exposing the data line. A conductive layer is formed on the second insulating interlayer and then patterned to form an electrode which connects the data line and the second impurity region through the first and third contact holes, and a pixel electrode which is connected through the second contact hole to the first impurity region.

According to the first embodiment of the present invention, a data line and a pixel electrode capable of being made from the same material are formed from the same layer. Contact holes for respectively connecting the data line and the pixel electrode to a source region and a drain region of an active pattern are simultaneously formed. Therefore, the number of used mask is reduced from 7 sheets to 5 sheets, thereby simplifying a manufacturing process.

According to the second embodiment of the present invention, in order to prevent the data line and the pixel electrode formed from the same layer, as described in the first embodiment, from being exposed to outside, a passivation layer is formed on the data line and the pixel electrode. At this time, since the passivation layer of a pad region is removed, a mask for patterning the passivation layer is further needed comparing with the first embodiment. The number of the mask is 6 sheets.

According to the third embodiment of the present invention, in a state that the surface of the insulating interlayer is not exposed by the photoresist pattern, since the gate insulating layer is etched to form contact holes, a surface damage of the insulating interlayer can be prevented.

According to the fourth embodiment of the present invention, after forming the data line, contact holes are formed at the same time. An electrode connected with the pixel electrode and the data line is formed from the same layer. That is, the image signal applied to the data line is transmitted to the drain region of the TFT through the drain electrode formed from the same layer as in the pixel electrode. Further, the pixel electrode is directly connected to the source region of a TFT without a separate source electrode. Therefore, the number of used mask is reduced from 7 sheets to 6 sheets.

According to the fifth embodiment of the present invention, in case the second insulating interlayer for insulating the data line and the pixel electrode is made of a photosensitive organic material, after patterning the second insulating interlayer through a developing process during an exposure process without a separate etching process, the contact holes for exposing the data line and the source/drain region is formed by a single photolithography process using a etching property difference between an oxide layer (or a nitride layer) and a metal layer in a dry etching process using fluorine-based gas.

According to the sixth embodiment of the present invention, it is possible to concurrently form contact holes having different depths using a slit mask or half-tone mask.

Therefore, according to the present invention, the number of mask is reduced as compared to a conventional method, thereby simplifying the manufacturing process and reducing the manufacturing time and cost.

BRIEF DESCRIPTION OF THE DRAWINGS

The above objects and other advantages of the present invention will become more apparent by describing in detail preferred embodiments thereof with reference to the attached drawings in which:

FIGS. 5A, 5B, 5C, 5D and 5E are cross-sectional views taken along the line A–A' of the FIG. 3 to show a method of manufacturing the polycrystalline silicon TFT;

FIG. 6 is a cross-sectional view of the polycrystalline silicon TFT according to the second embodiment of the present invention;

FIGS. 7A, 7B, 7C and 7D are cross-sectional views illustrating a method of manufacturing a polycrystalline silicon TFT according to the third embodiment of the present invention;

FIG. 9 is a cross-sectional view of the polycrystalline silicon TFT capable of applying to the fourth embodiment of the present invention;

FIGS. 10A, 10B, 10C, 10D and 10E are cross-sectional views taken along the line C–C' in FIG. 9 to show the method of manufacturing the polycrystalline silicon TFT;

DETAILED DESCRIPTION OF THE PREFERRED EMBODIMENTS

Now, preferred embodiments of the present invention will be described in detail with reference to the annexed drawings.

Embodiment 1

Figure 1A:
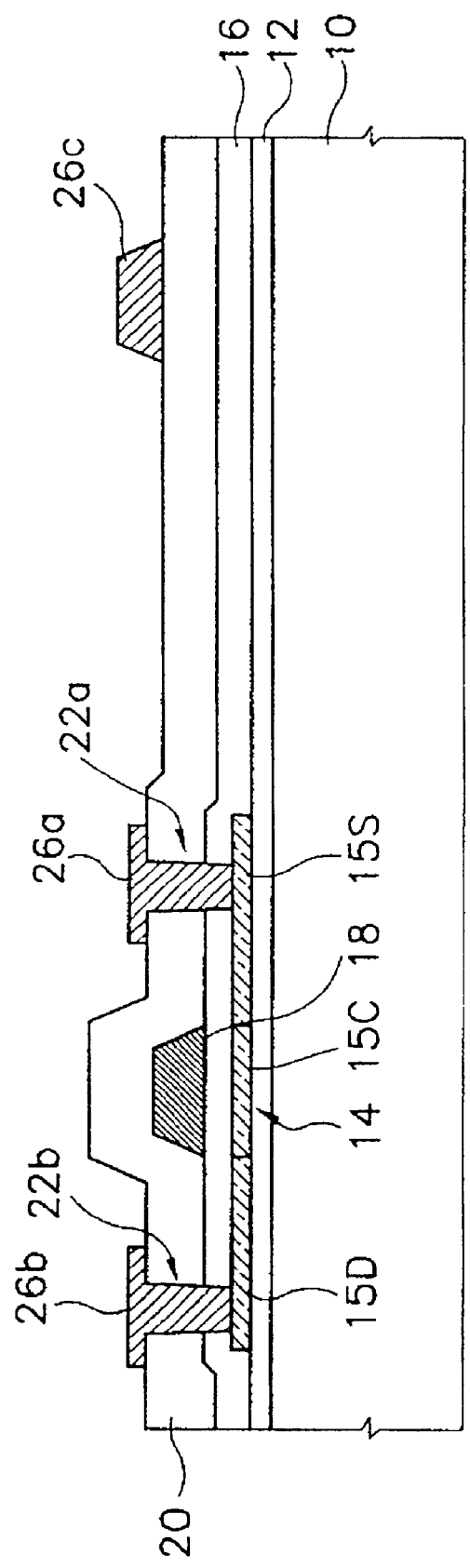
FIGS. 1A and 1B are cross-sectional views of a conventional method of manufacturing a polycrystalline TFT for an LCD device using seven sheets of mask.
Figure 1B:
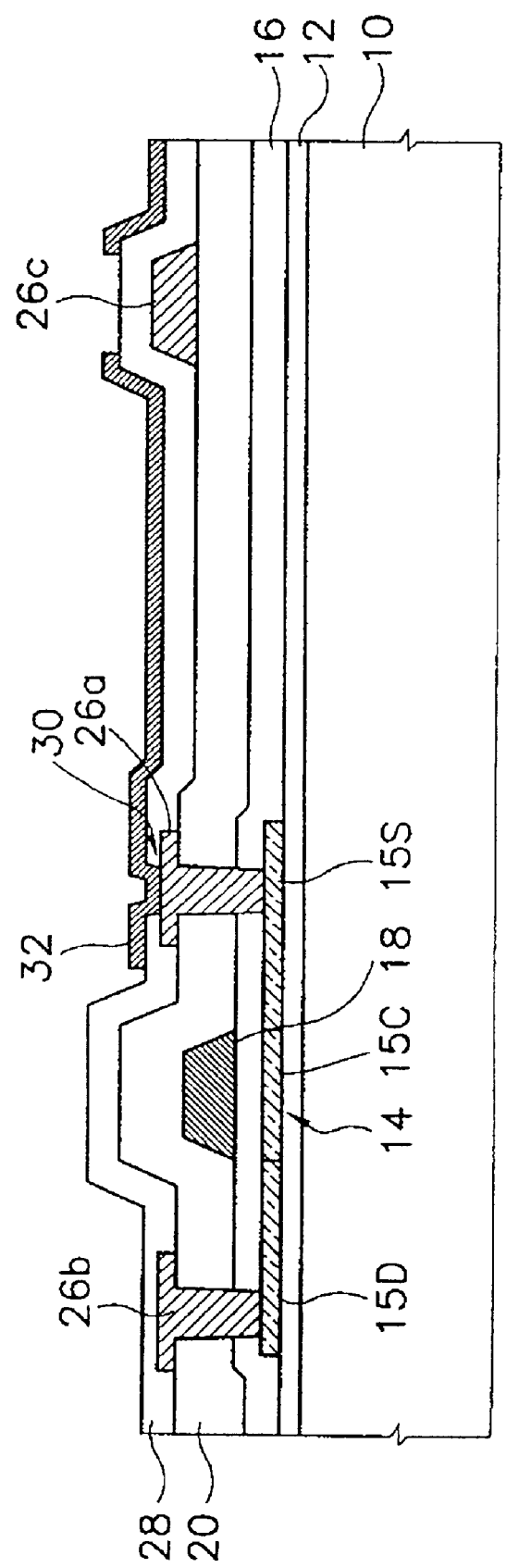
Figure 2:
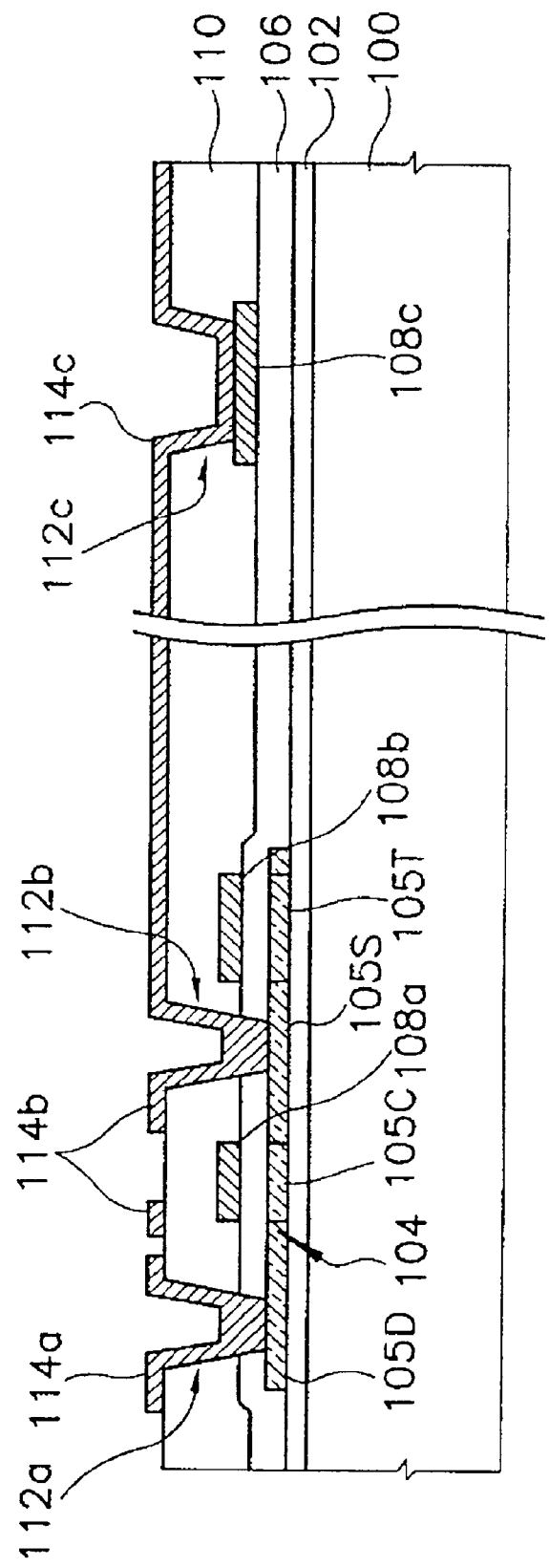
FIG. 2 is a cross-sectional view of a polycrystalline silicon TFT according to the first embodiment of the present invention.

FIG. 2 shows a cross-sectional view of a polycrystalline silicon TFT according to the first embodiment of the present invention.

Referring to FIG. 2, on a transparent substrate 100 made of a transparent insulating material such as glass, quartz or sapphire, there is formed a blocking layer 102. On the blocking layer 102 is formed a polycrystalline silicon active pattern 104. The active pattern 104 includes a lower electrode 105T formed integrally with the active pattern.

On the active pattern 104 and the blocking layer 102, there is formed a gate insulating layer 106 made of silicon nitride or silicon oxide. On the gate insulating layer 106 is formed a gate electrode 108a which crosses the active pattern 104 so as to define a source/drain region 105S and 105D. That is, a portion of the active pattern 104, which is overlapped with the gate electrode 108a, serves as a channel region 105C of a TFT, and one side of the active pattern 104, which is divided with respect to the channel region 105C positioned at the center, serves as the source region 105S and the other side serves as the drain region 105D. At this time, positions of the source region 105S and the drain region 105D may be exchanged each other.

Further, both a capacitor line (i.e., an upper electrode of the capacitor) 108b and a gate pad 108c for receiving a scanning signal from an external IC (not shown) are formed from the same layer as the gate electrode 108a. At this time, in order to increase storage capacitance, the source region 105S of the active pattern 104 is formed wider to be overlapped with the capacitor line 108b.

On the gate electrode 108a, the capacitor line 108b, the gate pad 108c and the gate insulating layer 106, there is formed an insulating interlayer 110 made of an organic insulating material and an inorganic insulating material such as SiO2, SiNx.

A data line 114a, a pixel electrode 114b and a conductive pattern 114c for connecting with the gate pad 108c are formed from the same layer on the insulating interlayer 110. The data line 114a is connected with the drain region 105D through the first contact hole 112a which is formed through the gate insulating layer 106 and the insulating interlayer 110 on the drain region 105D. The data line 114a transmits an image signal to the drain region 105D.

The pixel electrode 114b is directly connected with the source region 105S through the second contact hole 112b which is formed through the gate insulating layer 106 and the insulating interlayer 110 on the source region 105S. The pixel electrode 114b receives the image signal from the TFT to generate an electric field together with an electrode of an upper substrate. The pixel electrode 114b receives the image signal from the source region 105S of the TFT.

The conductive pattern 114c is connected with the gate pad 108c through the fourth contact hole 112c formed at the insulating interlayer 110 of an upper portion of the gate pad 108c.

According to the first embodiment of the present invention, the insulating interlayer 110 is etched to form the first and second contact hole 112a, 112b at the same time. Then, a conductive layer is deposited and patterned to form the data line 114a and the pixel electrode 114b at the same time.

Figure 3:
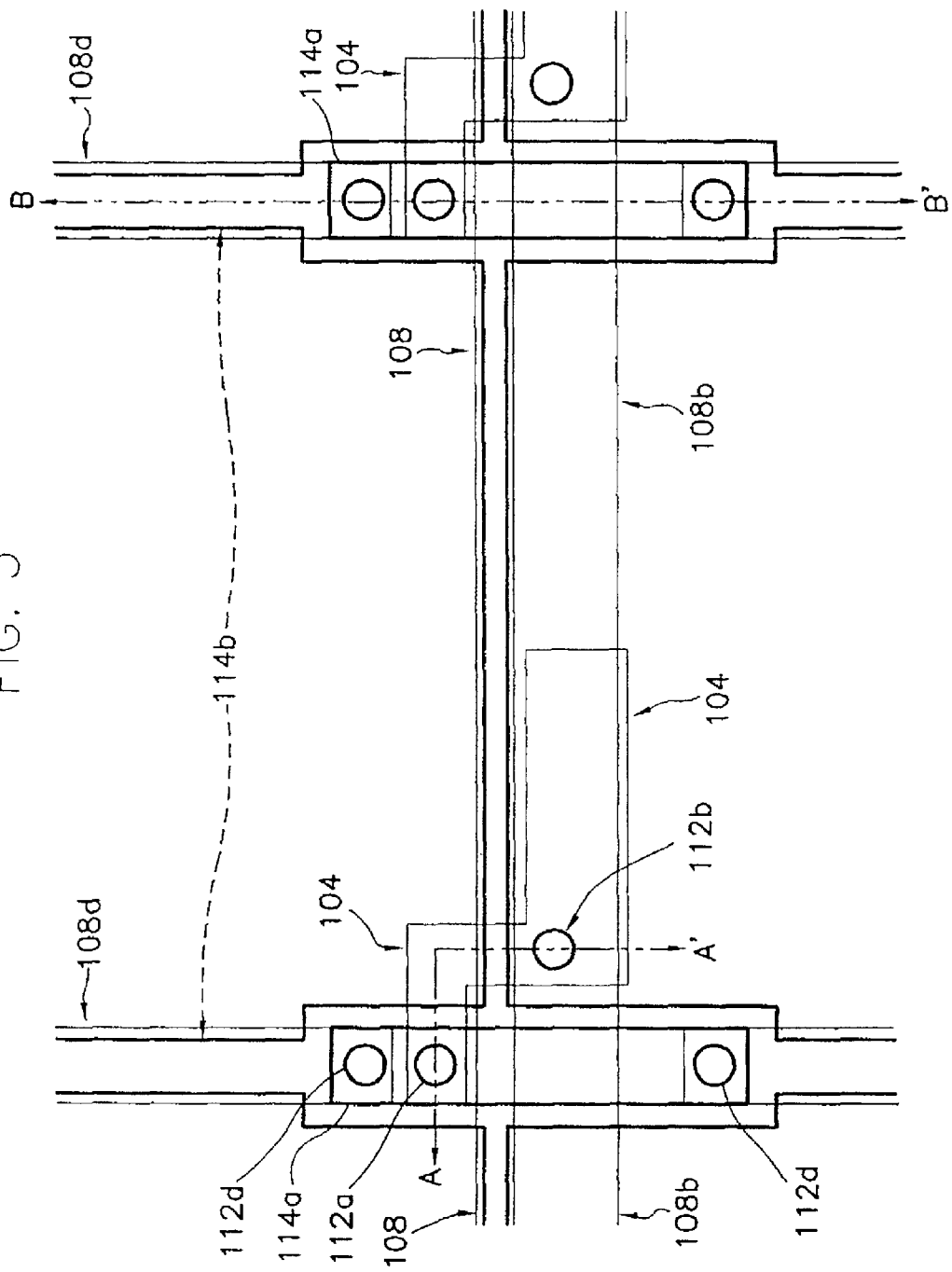
FIG. 3 is a plan view of the polycrystalline silicon TFT capable of applying to the first embodiment of the present invention.
Figure 4:
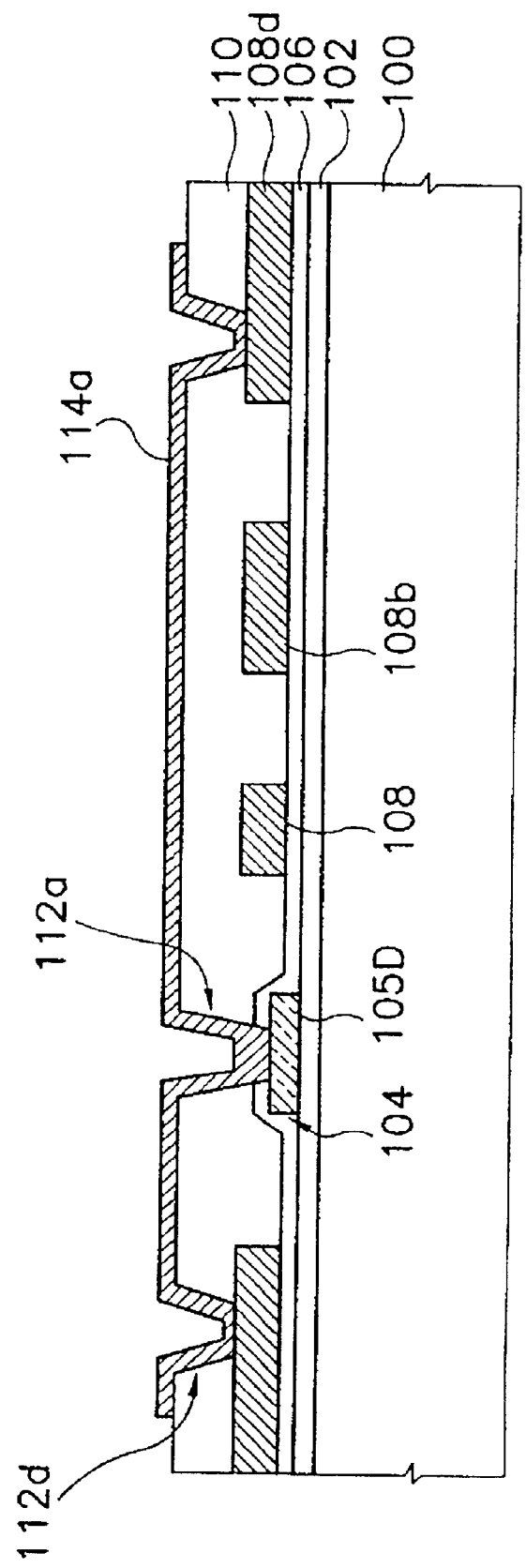
FIG. 4 is a cross-sectional view taken along the line B–B' of the FIG. 3.

FIG. 3 is a plan view of the polycrystalline silicon TFT capable of applying to the first embodiment of the present invention, and FIG. 4 is a cross-sectional view taken along the line B–B' of the FIG. 3. Here, FIG. 2 is a cross-sectional view taken along the line A–A' of FIG. 3.

Referring to FIGS. 3 and 4, on the transparent substrate is formed a gate line which is made of a single layer of aluminum or an aluminum-containing metal alloy such AlNd, or a multi-layered structure in which Cr or Mo alloy is stacked on the aluminum. The gate line including a gate line 108 extending in the first direction (I.e., laterally) in parallel with the capacitor line 108b, the gate pad (108c in FIG. 2) connected to an end of the gate line 108 to receive a scanning signal from an outside and to transmit the signal to the gate line 108 and the gate electrode (108a in FIG. 2) as a part of the gate line 108.

On the gate line 108, there is formed the data line 114a extending in the second direction (i.e., longitudinally). The active pattern 104 is formed to partially overlap with the data line 114a. The gate electrode as a part of the gate line 108 crosses the active pattern 104. A considerable portion of the capacitor line 108b is overlapped with a lower region (i.e., the source region) of the active pattern 104 crossed by the gate electrode. A portion of the active pattern 104, which is overlapped with the data line 114a, servers as the drain region 105D. That is, the data line 114a is directly connected with the drain region 105D through the first contact hole 112a formed on the drain region 105D. The second contact hole 112b is formed on the source region 105S of the active pattern 104. The pixel electrode 114b formed from the same layer as the data line 114a is directly connected through the second contact hole 112b with the source region.

Further, a signal transmission line 108d is formed along in the second direction perpendicular to the gate line 108 and is spaced apart from the gate line 108 at a desired interval. The signal transmission line 108d is formed at the same time when patterning a gate film for the gate line. The signal transmission line 108d is connected through the drain region 114a with the drain region 105D of the TFT to transmit the image signal to the drain region 105D. In this situation, the data line 114a connects the signal transmission line 108d and the drain region 105D through the first contact hole 112a formed at the drain region 105D and the third contact hole 112d formed at the signal transmission line 108d.

FIGS. 5A, 5B, 5C, 5D and 5E are cross-sectional views illustrating a method of manufacturing the polycrystalline silicon TFT to show a pixel portion of the substrate, on which the TFT is formed.

Figure 5A:
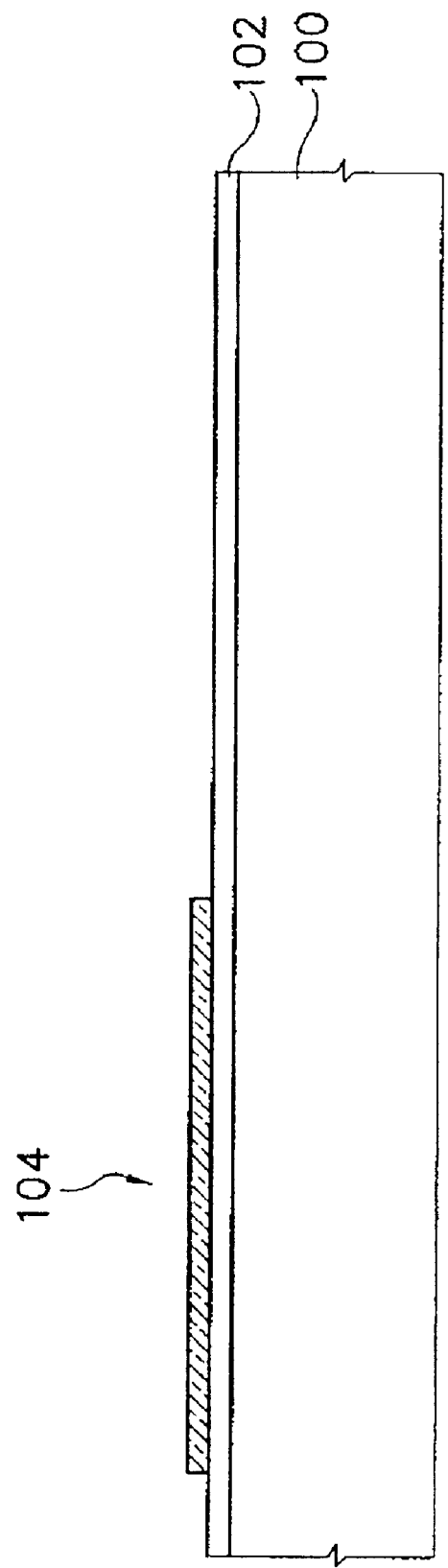

FIG. 5A shows a step of forming the active pattern 104. On the transparent substrate 100 made of an insulating material such as glass, quartz and sapphire is deposited silicon oxide to a thickness of 1000 Å to form a blocking layer 102. The blocking layer 102 may be omitted. However, it is preferred that the blocking layer is employed to prevent various impurities in the substrate 100 from penetrating into a silicon layer during crystallization of an amorphous silicon layer.

After the amorphous silicon layer is deposited on the blocking layer 102 by a chemical vapor deposition to a thickness of about 500 Å, a laser annealing process or a furnace annealing process is performed to crystallize the amorphous silicon layer into the polycrystalline silicon layer. Then, the polycrystalline silicon layer is patterned to form the active pattern 104 (using the first mask).

FIG. 5B shows a process of forming the gate line. On the active pattern 104 and the blocking layer 102, the silicon oxide or the silicon nitride is deposited by a chemical vapor deposition to form the gate insulating layer 106. After a gate conductive layer is deposited on the gate insulating layer 106, the gate conductive layer is patterned to form the gate line and the capacitor line 108b. At this time, the signal transmission line (108d in FIG. 3) may be formed extending perpendicularly to the gate line, while being apart from the gate line at a desired interval. The signal transmission line is connected with the data line in a subsequent process to have a function of transmitting the image signal to the drain region 105D.

The gate line includes the gate line (108 in FIG. 3) formed in a display region, the gate electrode 108a as a part of the gate line and the gate pad 108c formed at a pad region positioned at an outside of the display region. The gate pad 108c receives the scanning signal from an outside and transmits the signal to the gate line 108.

The gate conductive layer is made of the single layer of aluminum or an aluminum-containing metal alloy such AlNd, or the multi-layered structure in which Cr or Mo alloy is stacked on the aluminum.

Now, a gate patterning process is described in detail.

After the gate conductive layer of a p-type TFT region is etched using a photolithography process in order to form the gate electrode (not shown) of a p-type TFT (using the second mask), p-type impurity is ion-implanted to form the source/drain region. Sequentially, the gate conductive layer of an n-type TFT region is etched using the photolithography process to form the gate electrode 108a of an n-type TFT (using the third mask). Then, n-type impurity is ion-implanted to form the source/drain region (105S, 105D). The gate electrode 108a blocks the impurity upon the impurity-ion implanting process to define the channel region 105C at the active pattern 104, which is positioned at a lower portion of the gate electrode 108a. Here, it does not matter that the process order of forming the gate and the source/drain of the p-type TFT and the n-type TFT is reversed. Further, the source/drain of the n-type TFT may be formed to have an LDD structure.

Although not showing at the pixel portion, in order to form a drive circuit having a CMOS structure, a masking process for patterning of the gate electrode of the p-type TFT and ion-implanting of the source/drain, and other masking process for patterning of the gate electrode of the n-type TFT and ion-implanting of the source/drain are performed at a drive circuit portion. For example, in the masking process with respect to the n-type TFT region, the patterning of the gate electrode is performed together with the ion-implanting of the source/drain.

FIG. 5C shows a process of forming the insulating interlayer 110. As described above, after completion of the gate electrode patterning and the source/drain ion-implanting, the annealing process using laser beam, etc. is performed to activate the doped ions and recover damage of the semiconductor layer. Then, on the gate line, the capacitor line 108b and the gate insulating layer 106, there is formed the insulating interlayer 110 to a thickness of a few thousands Å. The insulating interlayer 110 may be made of an inorganic insulating material of the silicon oxide, the silicon nitride or a combination thereof, or an acrylic photosensitive organic insulating material. In case of employing the photosensitive organic layer, the patterning is achieved through a developing process after an exposing process without a separate etching process. Further, on an upper surface of the insulating interlayer 110, there is formed embossed portion (convex portions each having a lens shape) by the exposing process in which light amount is partially controlled. Then, the pixel electrode made of a reflective material is formed thereon, thereby scattering light transmitted through liquid crystal by the embossed portion and improving a visual angle.

Figure 5D:
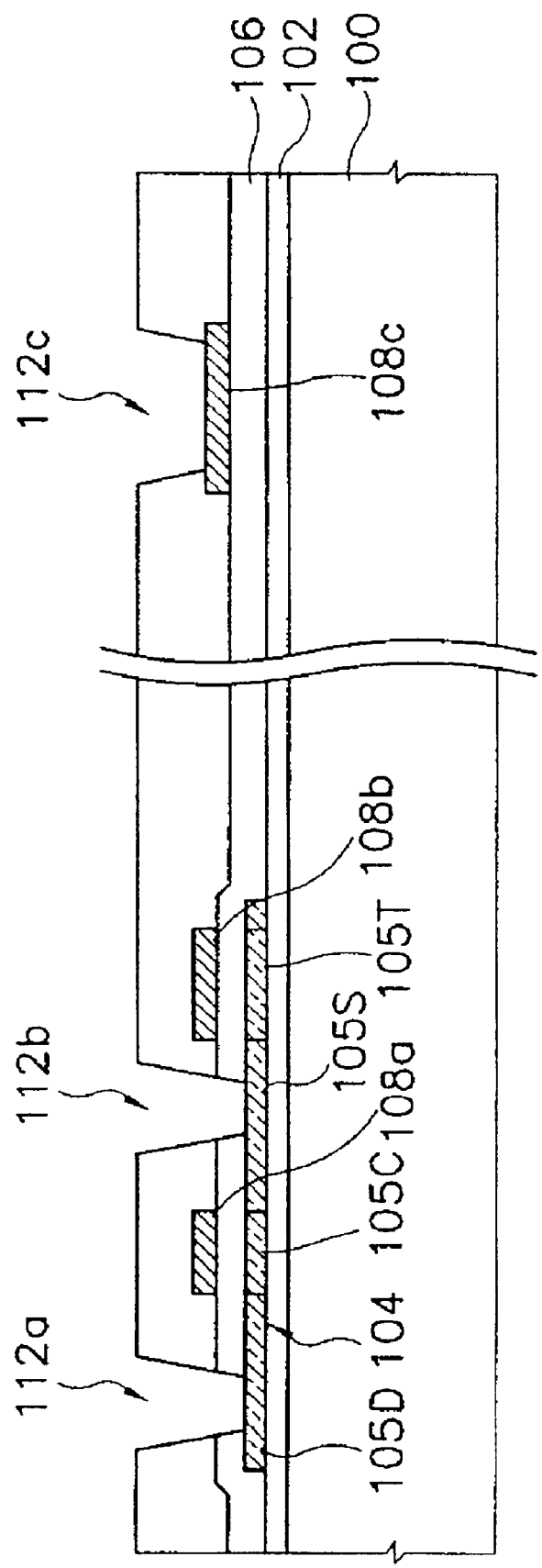

FIG. 5D shows a process of forming the contact holes. The insulating interlayer 110 and the gate insulating layer 106 are partially etched using the photolithography process to form the first contact hole 112a for exposing the drain region 105D of the active pattern 104, the second contact hole 112b for exposing the source region 105S, the third contact hole 112d for exposing the signal transmitting pad (108d in FIG. 3) and the fourth contact hole 112c for exposing the gate pad (108c) (using the fourth mask).

FIG. 5E shows a process of depositing the conductive layer 114 on the first to third contact holes 112a, 112b, 112d and the insulating interlayer 110. In this embodiment, since the conductive layer 114 is patterned to form the data line 114a and the pixel electrode 114b, in case of a reflective LCD, a metal having a high reflectivity such as Al is used for the conductive layer 114. In case of a backlight LCD, a transparent conductive layer such as ITO (indium-tin-oxide) layer or IZO (indium-zinc-oxide) layer is used.

Then, the conductive layer 114 is etched using the photolithography process to form the data line 114a, the pixel electrode 114b and the conductive pattern 114c for connecting to the gate pad as shown in FIG. 2 (using the fifth mask). The data line 114a is connected to the drain region 105D through the first contact hole 112a which is formed through the gate insulating layer 106 and the insulating interlayer 110 on the drain region 105D. In addition, the data line 114b connects the signal transmission line 108d and the drain region 105D through the first contact hole 112a formed on the drain region 105D and the third contact hole (112d in FIG. 3) formed on the signal transmission line (108d in FIG. 3).

The pixel electrode 114b is directly connected to the source region 105S through the second contact hole 112b which is formed through the gate insulating layer 106 and the insulating interlayer 110 on the source region 105S. The conductive pattern 114c is connected to the gate pad 108c through the third contact hole 112c which is formed at the insulating interlayer 110 of an upper portion of the gate pad 108c.

Embodiment 2

FIG. 6 shows a cross-sectional view of the polycrystalline silicon TFT according to the second embodiment of the present invention.

Referring to FIG. 6, after forming a data line 114a, a pixel electrode 114b and a conductive pattern 114c for connecting to a gate pad (using the fifth mask) in the same manner as in Embodiment 1, an inorganic insulating material such as silicon nitride (SiNx) is deposited on an entire surface of an resultant material to form a passivation layer 116. Then, the passivation layer 116 on the conductive pattern 114c is etched using the photolithography process to expose the conductive pattern 114c (using the sixth mask).

If the passivation layer is formed as described above, the number of mask is increased to 6 sheets, comparing to Embodiment 1. However, there is an advantage of preventing the data line 114a and the pixel electrode 114b from being contaminated and protecting the pattern. Preferably, the passivation layer 116 has a desired thickness so that generation of an electric field between the pixel electrode and an electrode of an upper substrate thereof may be prevented.

Embodiment 3

FIGS. 7A to 7D are cross-sectional views illustrating a method of manufacturing a polycrystalline silicon TFT according to the third embodiment of the present invention.

Referring to FIG. 7A, on a transparent substrate 100, there are formed a blocking layer 102, an active pattern 104, a gate insulating layer 106, a gate line and a capacitor line 108b in the same manner as in Embodiment 1. The gate line includes a gate line formed in a display region, a gate electrode 108a as a part of the gate line and a gate pad 108c formed at a pad region positioned at an outside of the display region. During the formation of the gate line, a signal transmission line (not shown) spaced apart by a predetermined distance from the gate line and extending in a direction perpendicular to the gate line is also formed together with the gate line.

Then, an organic insulating material is deposited on the gate line, the capacitor line 108b and the gate insulating layer 110 to a thickness of a few thousands Å to form an insulating interlayer 110. On the insulating interlayer 110, a photoresist film 111 coated.

Referring to FIG. 7B, the photoresist film is exposed and developed to form a photoresist pattern 111a defining contact hole regions.

Figure 7C:
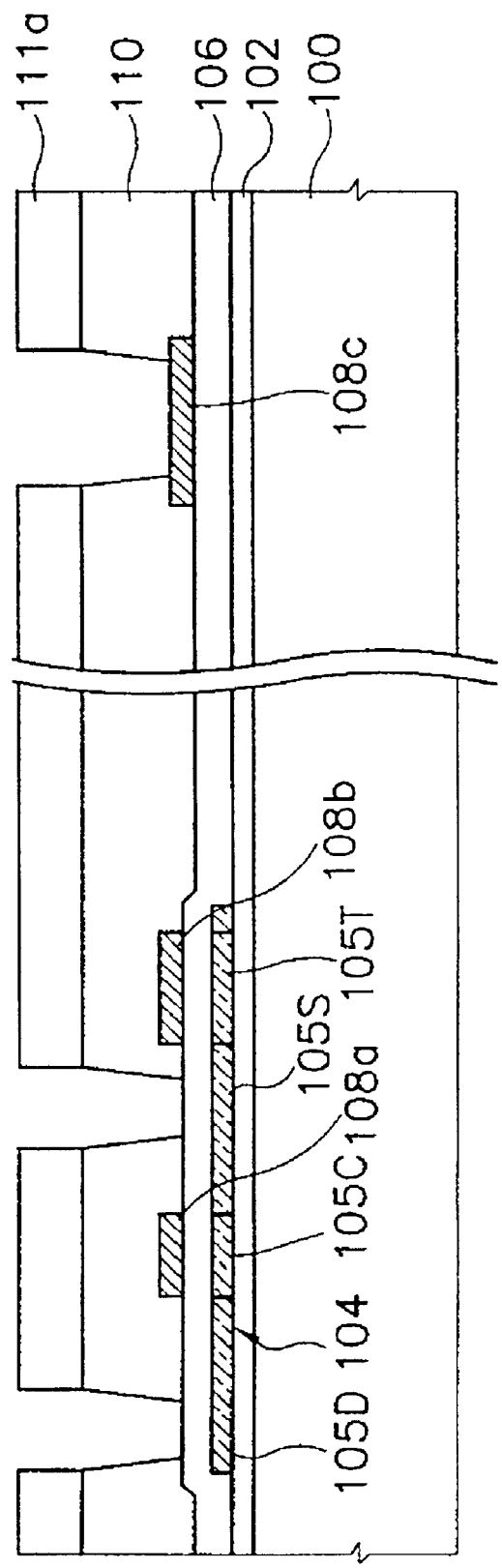

Referring to FIG. 7C, the exposed insulating interlayer 110 is developed using the photoresist pattern as a mask. Thus, the exposed insulating interlayer 110 corresponding to the contact hole regions is removed.

Referring to FIG. 7D, the exposed insulating interlayer 110 is then dry-etched using the photoresist pattern as a mask. As a result, there are concurrently formed the first contact hole 112a for exposing drain region 105D of active pattern 104, the second contact hole 112b for exposing source region 105S, the third contact hole (not shown) for exposing signal transmission line and the fourth contact hole 112c for exposing gate pad 108c (using the fourth mask).

Subsequently, although not shown in the figures, the photoresist pattern 11a is removed by an ashing and strip process. Then, a conductive film is deposited on the contact holes and the insulating interlayer 110 and then patterned using a photolithography process to form data line, pixel electrode and gate pad conductive pattern at the same time.

Embodiment 4

Figure 8:
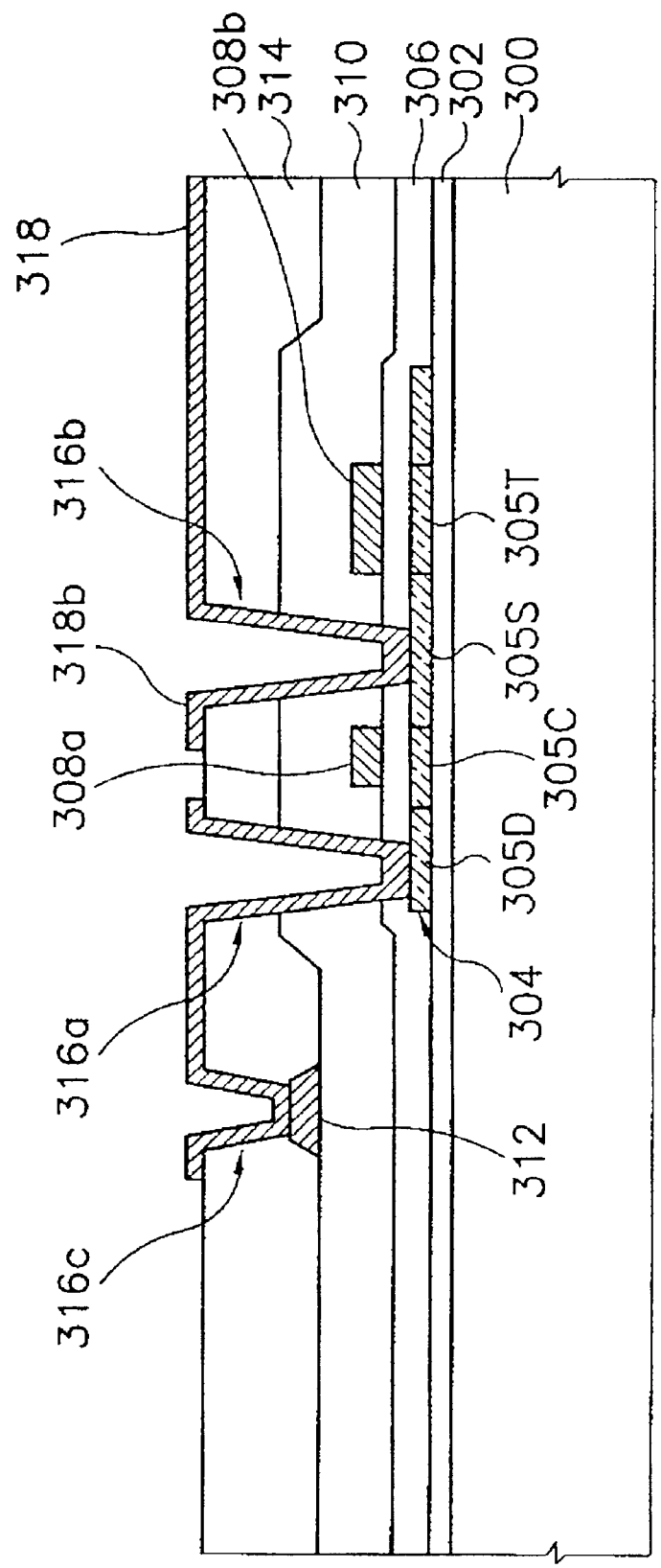
FIG. 8 is a cross-sectional view of the polycrystalline silicon TFT according to the fourth embodiment of the present invention.

FIG. 8 shows a cross-sectional view of the polycrystalline silicon TFT according to the fourth embodiment of the present invention.

Referring to FIG. 8, a blocking layer 302 made of silicon oxide is formed on a transparent substrate 300 made of an insulating material such as glass, quartz and sapphire. On the blocking layer 302 is formed a polycrystalline silicon active pattern 304. A lower electrode 305T of a capacitor is integrally formed at the active pattern 304.

On the active pattern 304 and the blocking layer 302, there is formed a gate insulating layer 306 made of silicon nitride or silicon oxide. On the gate insulating layer 306 is formed a gate electrode 308a which crosses the active pattern 304 so as to define a source/drain region 305S, 305D. That is, a portion of the active pattern 304, which is overlapped with the gate electrode 308a, serves as a channel region 305C of a TFT, and one side of the active pattern 304, which is divided with respect to the channel region 305C positioned at the center, serves as the source region 305S and the other side serves as the drain region 305D. At this time, positions of the source region 305S and the drain region 305D may be exchanged each other.

Further, a capacitor line (i.e., an upper electrode of the capacitor) 308b and a gate pad for receiving a scanning signal from an external IC (not shown) are formed from the same layer as in the gate electrode 308a. At this time, in order to increase storage capacitance, the source region 305S of the active pattern 304 is formed wider to be overlapped with the capacitor line 308b.

On the gate electrode 308a, the capacitor line 308b and the gate insulating layer 306, there is formed the first insulating interlayer 310 which is made of an inorganic material such as SiO2 and SiNx, or an acrylic photosensitive organic material.

On the first insulating interlayer 310 is formed a data line 312 which is made of a single layer of aluminum or an aluminum-containing metal alloy such AlNd, or a multi-layered structure in which Cr or Mo alloy is stacked on the aluminum. The data line 312 transmits an image signal to the drain region 305D. Therefore, it is preferred that the data line 312 is made of a metal having high conductivity so as to reduce loss of the image signal when transmitting the image signal.

On the data line 312 and the first insulating interlayer 310 is formed the second insulating interlayer 314 of the inorganic material such as SiO2 and SiNx, or the acrylic photosensitive organic material. On the second insulating interlayer 314, there is formed a pixel electrode 318b which is directly connected with the source region 305S through the second contact hole 316b formed through the gate insulating layer 306, the first insulating interlayer 310 and the second insulating interlayer 314 on the source region 305S. On the second insulating interlayer 314, there is formed a drain electrode 318a which connects the data line 312 and the drain region 305D through the first contact hole 316a formed through the gate insulating layer 306, the first insulating interlayer 310 and the second insulating interlayer 314 on the drain region 305D and the third contact hole 316c formed at the second insulating interlayer 314 on the data line 312. The drain electrode 318a and the pixel electrode 318b are formed from the same layer. When the positions of the source region 305S and the drain region 305D are exchanged each other, an electrode connected to the data line 312 is served as a source electrode. The pixel electrode 318b is directly connected to the drain region 305D.

The pixel electrode 318b has a function of receiving the image signal from the TFT to generate an electric field together with an electrode (not shown) of an upper substrate, and receiving the image signal from the source region 305S.

According to this embodiment of the present invention, the first and third contact holes 316a, 316c for connecting the data line 312 and the drain region 305D and the second contact hole for connecting the pixel electrode 318b to the source region 305S are formed at the same time, thereby reducing the number of mask from seven sheets to six sheets.

FIG. 9 shows a plan view of the polycrystalline silicon TFT which may be manufactured according to this embodiment of the present invention.

Referring to FIG. 9, on the transparent substrate is formed a gate line which is made of a single layer of aluminum or an aluminum-containing metal alloy such AlNd, or a multi-layered structure in which Cr or Mo alloy is stacked on the aluminum. The gate line comprises a gate line 308 extending in the first direction (I.e., laterally) in parallel with the capacitor line 308b, the gate pad (not shown) connected to an end of the gate line 308 to receive a scanning signal from an outside and transmit the signal to the gate line 308 and the gate electrode (308a in FIG. 9) of the TFT, which is a part of the gate line 308.

On the gate line, there is formed the data line 312 extending in the second direction (i.e., longitudinally) perpendicular to the first direction. The active pattern 304 is formed to be apart from the data line 312 at a desired interval. The gate electrode branched from the gate line 108 crosses the active pattern 104. A considerable portion of the capacitor line 308b is overlapped with a lower region (i.e., the source region) of the active pattern 304 crossed by the gate electrode. An upper region (i.e., the drain region) of the active pattern 104 crossed by the gate electrode is connected to the data line 312 by the drain electrode 316c. For this connection, the first contact hole 316a is formed at the drain region, and the third contact hole 316b is formed at a desired portion of the data line 312.

The second contact hole 316b is formed at the drain region of the active pattern 304. The pixel electrode 316b formed from the same layer as in the drain electrode 316c is directly connected through the second contact hole 316b to the source region.

FIGS. 10A, 10B, 10C, 10D and 10E show cross-sectional views taken along the line C–C' of FIG. 9 to describe a method of manufacturing the polycrystalline silicon TFT.

Figure 10A:
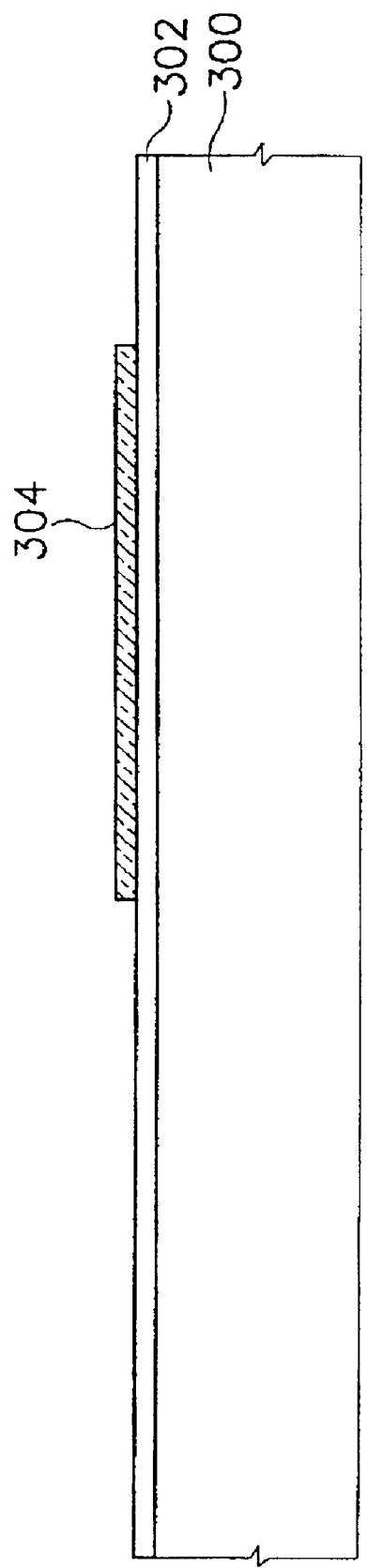

FIG. 10A shows a step of forming the active pattern 304. On the transparent substrate 300 made of an insulating material such as glass, quartz and sapphire is deposited silicon oxide to a thickness of 1000 Å to form a blocking layer 302. The blocking layer 302 may be omitted. However, it is preferred that the blocking layer is employed to prevent various impurities in the substrate 300 from penetrating into a silicon layer during crystallization of an amorphous silicon layer.

After the amorphous silicon layer is deposited on the blocking layer 302 by a chemical vapor deposition to a thickness of about 500 Å, a laser annealing process or a furnace annealing process is performed to crystallize the amorphous silicon layer into the polycrystalline silicon layer. Then, the polycrystalline silicon layer is patterned using a photolithography process to form the active pattern 304 (using the first mask).

Figure 10B:
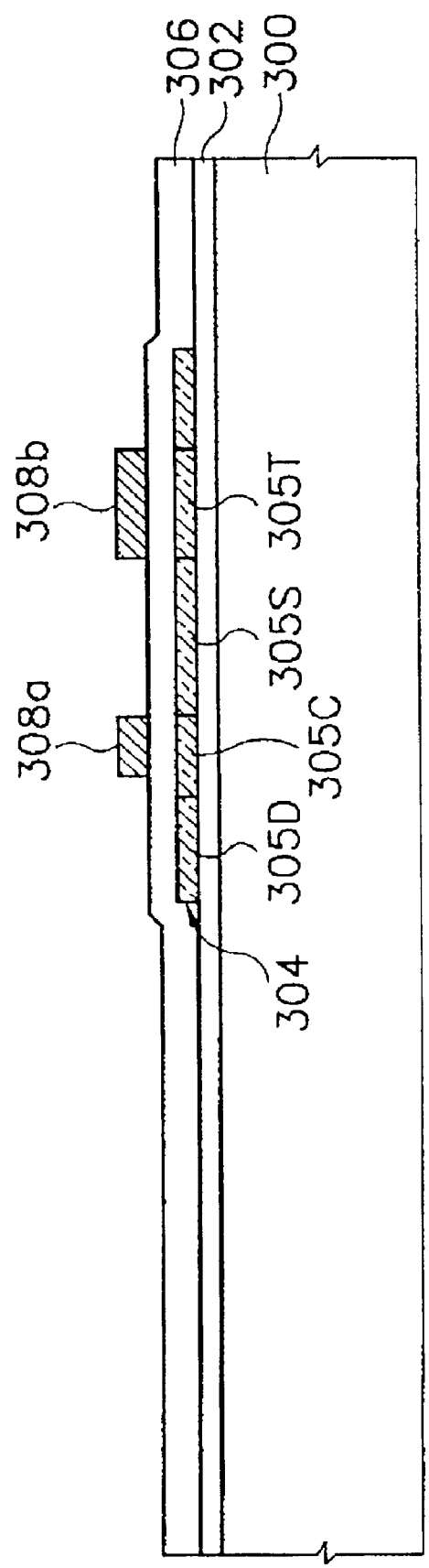

FIG. 10B shows a process of forming the gate line. On the active pattern 304 and the blocking layer 302 is deposited the silicon oxide or the silicon nitride by the chemical vapor deposition to form the gate insulating layer 306. After a gate conductive layer is deposited on the gate insulating layer 306, the gate conductive layer of a p-type and an n-type TFT is patterned using the photolithography process to form the gate line. An ion-implanting process at the p-type and an n-type source/drain is performed (using the second and third masks). At this time, the capacitor line 308b is formed in parallel with the gate line 308 at the same time.

The gate line includes the gate line (308 in FIG. 3) formed in a display region, and the gate electrode 308a as a part of the gate line and the gate pad (not shown) formed at a pad region positioned outside of the display region. The gate pad receives the scanning signal from an outside and transmits the signal to the gate line 308. The gate conductive layer is made of the single layer of aluminum or an aluminum-contained metal alloy such AlNd, or the multi-layered structure in which Cr or Mo alloy is stacked on the aluminum.

FIG. 10C shows a process of forming the first insulating interlayer 310, the data line 312 and the second insulating interlayer 314. As described above, after completing the gate electrode patterning and the source/drain ion-implanting, the annealing process using laser beam, etc. is performed to activate the doped ions and recover the damage of the semiconductor layer. Then, on the gate line, the capacitor line 308b and the gate insulating layer 306, there is formed the first insulating interlayer 310 to a thickness of few thousand Å. The first insulating interlayer 310 may be made of an inorganic insulating material of the silicon oxide, the silicon nitride or a combination thereof, or an acrylic photosensitive organic material. In case of employing the photosensitive organic layer, the patterning is achieved through a developing process during an To exposing process without a separate etching process.

Further, on the first insulating interlayer 310, there is formed a conductive layer to a thickness of about 2000 Å. The conductive layer is etched by the photolithography process to form the data line 312 (using the fourth mask). Preferably, the data line 312 is made of the metal having high conductivity so as to reduce loss of the image signal when transmitting the image signal. Therefore, the data line 312 is made of the single layer of aluminum or an aluminum-containing metal alloy such AlNd, or the multi-layered structure in which Cr or Mo alloy is stacked on the aluminum.

On the data line 312 and the first insulating interlayer 310, there is formed the second insulating interlayer 314 to a thickness of few thousand Å. Preferably, the second insulating interlayer 314 is made of the inorganic insulating material such as the silicon oxide, the silicon nitride or a combination thereof.

FIG. 10D shows a step of forming the contact holes. The second insulating interlayer 314, the first insulating interlayer 310 and the gate insulating layer 306 are partially etched by a photolithography process to form the first contact hole 316a for exposing the drain region 305D of the active pattern 304, the second contact hole 316b for exposing the source region 305S and the third contact hole 316c for exposing data line 312 (using the fifth mask). In addition, the fourth contact hole (not shown) for exposing the gate pad is also formed together with the first to third contact holes 316a, 316b and 316c.

Here, the second insulating interlayer 314, the first insulating interlayer 310 and the gate insulating layer 306 should be etched to form the first and second contact holes 316a, 316b. The second insulating interlayer 314 should be etched to form the third contact hole 316c. Further, the second and first interlayer contact holes 314, 310 should be etched to form the fourth contact hole. Therefore, since the number of layer to be etched is respectively different, there is a problem that the contact holes are not formed at the same time.

In this embodiment, to solve the above problem, the etching process is performed by a dry etching method using a fluorine-based gas. The oxide layer and the nitride layer forming the insulating interlayer and the gate insulating layer are continuously etched, while producing a volatile by-product. However, on the other hand, the metal layer forming the data line reacts with the fluorine-based gas to produce a non-volatile by-product. Since a surface of the metal layer is passivated, the metal layer is not etched any more or an etching speed is remarkably reduced. Therefore, the first to fourth contact holes, which respectively have a different depth, can be formed at the same time using the characteristics like this.

Further, the contact holes respectively having a different depth may be formed using a mask that has a full-exposure pattern together with a slit pattern for lowering an exposure intensity.

Figure 10E:
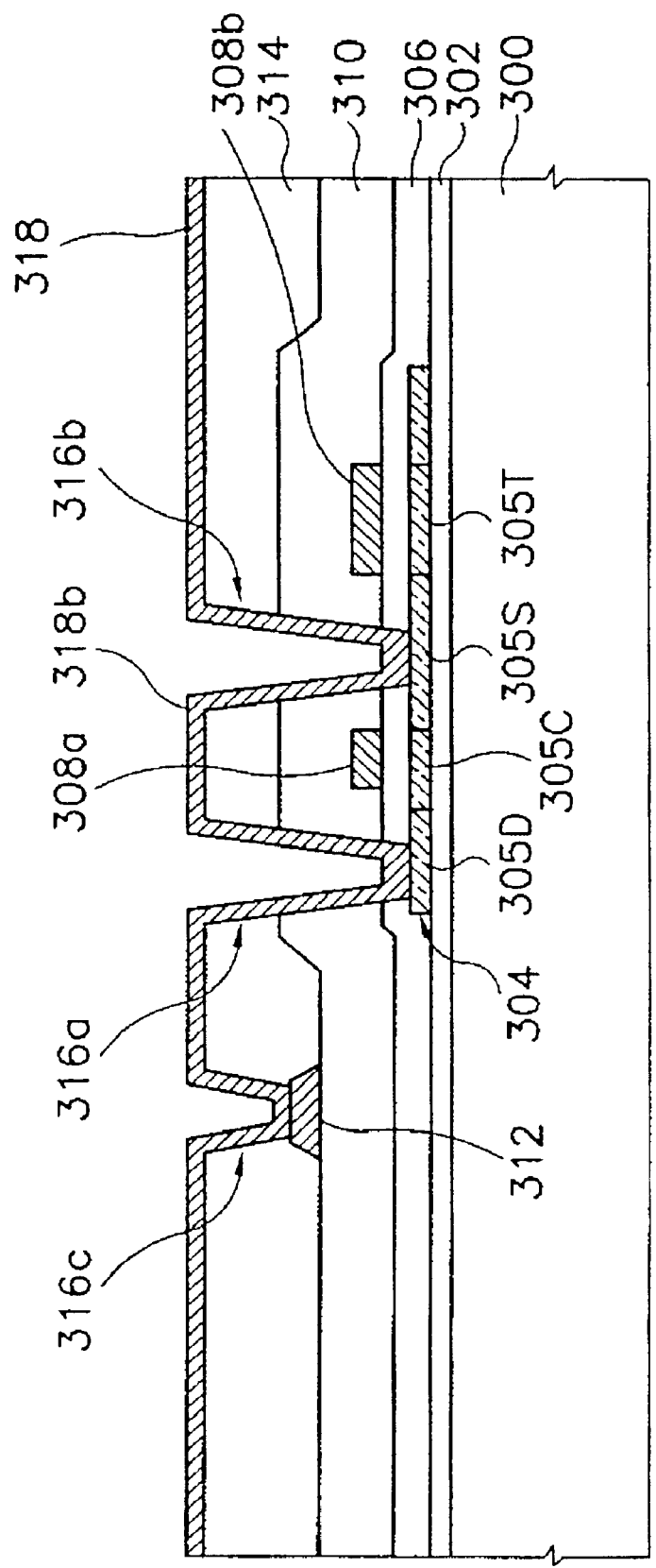

FIG. 10E shows a process of depositing the conductive layer 318 on the first to third contact holes 316a, 316b, 316c and the second insulating interlayer 314. In this embodiment, since the conductive layer 318 is patterned to form the pixel electrode, in case of a reflective LCD, a metal having high reflectivity such as Al is used as the conductive layer 318. In case of a backlight LCD, a transparent conductive layer such as ITO (indium-tin-oxide) or IZO (indium-zinc-oxide) is used.

Then, the conductive layer 318 is patterned using the photolithography process to form the drain electrode 318a and the pixel electrode 318b (using the sixth mask), as shown in FIG. 9. The drain electrode 318a connects the drain region 305D and the data line 312 through the first contact hole 316a which is formed through the gate insulating layer 306, the first insulating interlayer 310 and the second insulating interlayer 314 on the drain region 305D and the third contact hole 316c which is formed through the second insulating interlayer 314 on an upper portion of the data line 312.

The pixel electrode 318b is directly connected with the source region 305S through the second contact hole which is formed through the gate insulating layer 306, the first insulating interlayer and the second insulating interlayer on an upper portion of the source drain 305S.

Moreover, although not shown in the drawings, when patterning the conductive layer 318, a gate pad conductive pattern is formed at the gate pad region. The gate pad conductive pattern is connected with the gate pad through the fourth contact hole which is formed through the first and second insulating interlayers 310, 314 on an upper portion of the gate pad.

Embodiment 5

Figure 11A:
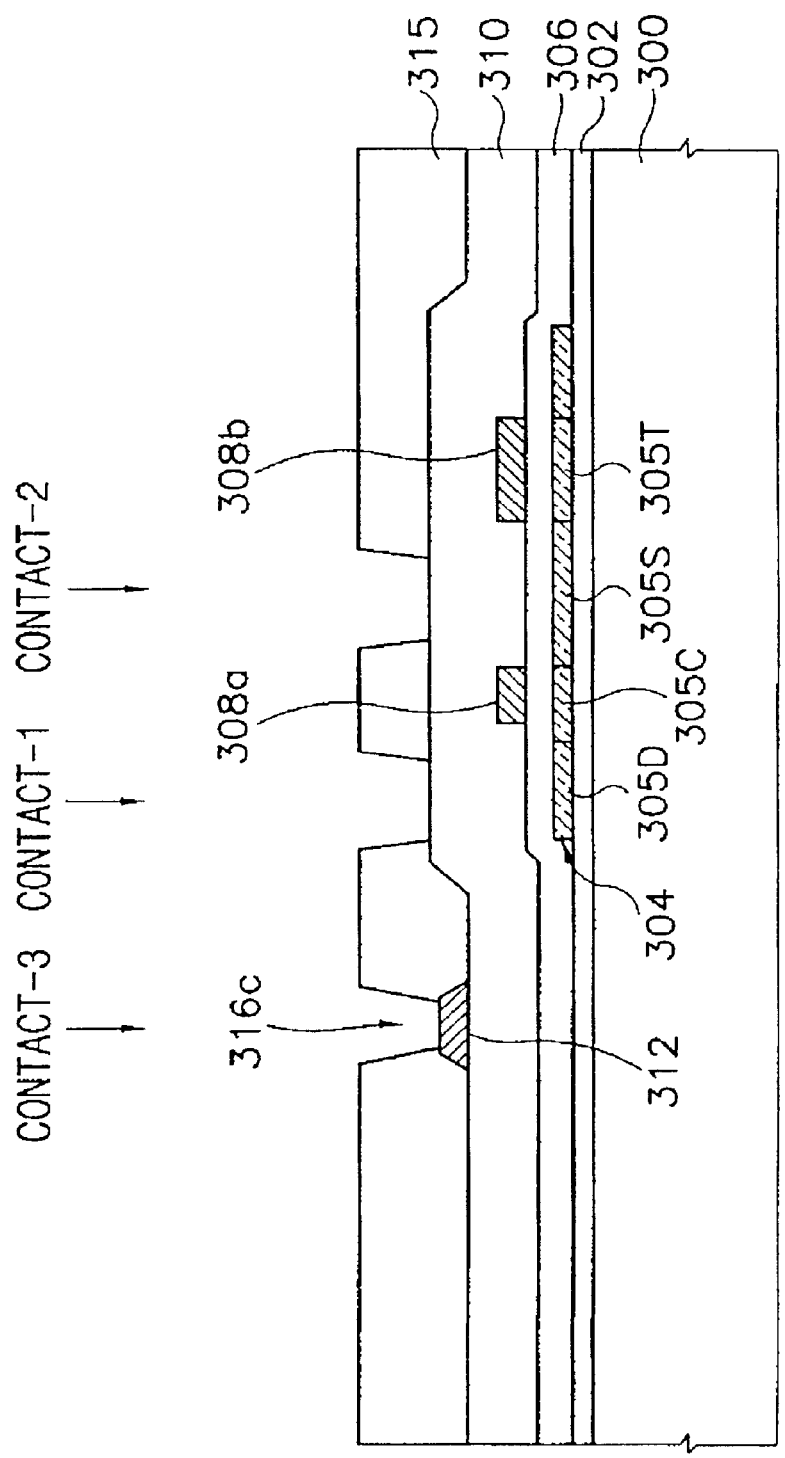
FIGS. 11A and 11B are cross-sectional views illustrating a method of manufacturing a polycrystalline silicon TFT according to the fifth embodiment of the present invention.
Figure 11B:
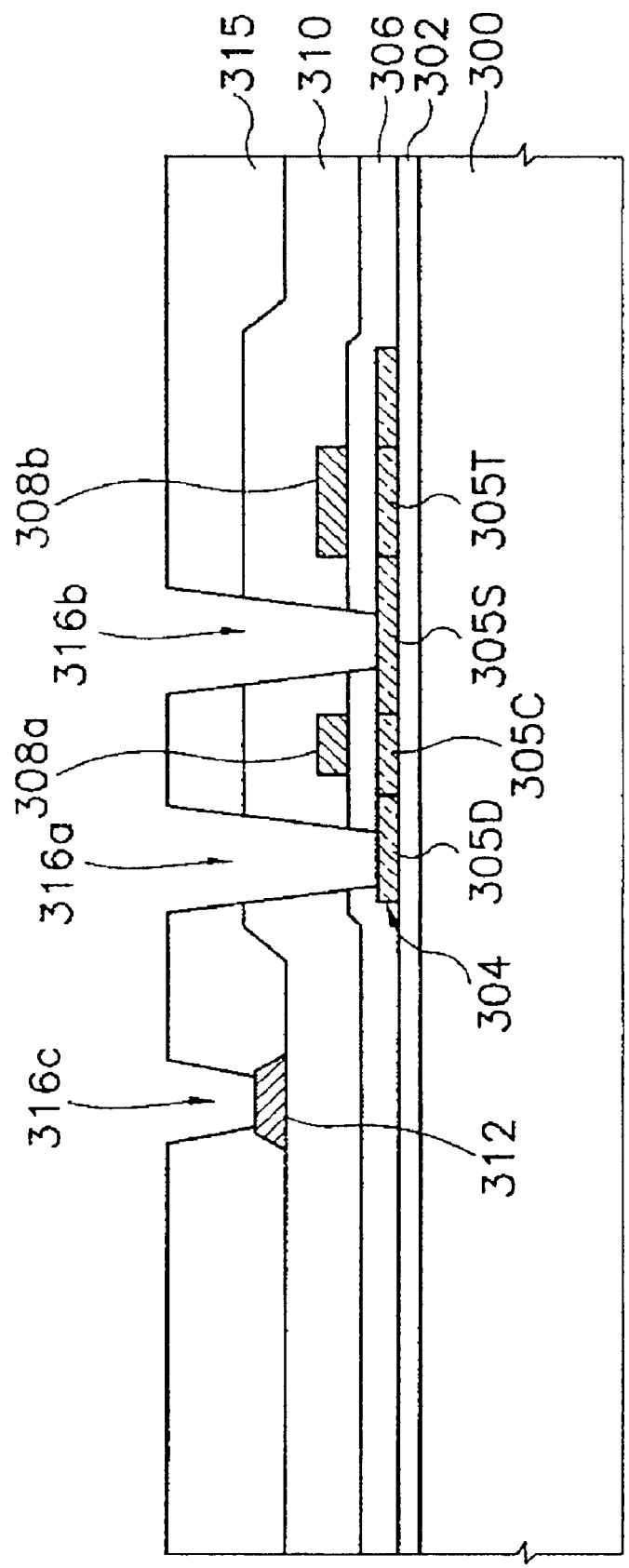

FIG. 11A and FIG. 11B show cross-sectional illustrating a method of manufacturing the polycrystalline silicon TFT according to the fourth embodiment of the present invention.

Referring to FIG. 11A, after forming a capacitor line 308b and a gate line including a gate electrode 308a, a gate line and a gate pad in the same method as in Embodiment 5 of the present invention, an inorganic insulating material of an oxide (SiO2), a nitride (SiNx) and a combination thereof is deposited thereon to form the first insulating interlayer 310.

A metallic data line 312 is formed on the first insulating interlayer 310. Then, on the first insulating interlayer 310 and the data line 312, there is formed the second insulating interlayer to 315 made of an acrylic photosensitive organic material.

If the second insulating interlayer 315 is exposed and developed using a mask, the second insulating interlayer 315 is removed at the third contact region of an upper portion of the data line 312 to form the third contact hole 316c for exposing the data line 312. Also, the first insulating interlayer 310 and the gate insulating layer 306 remain on the second contact region and the first contact region of an upper portion of a source/drain region 305S, 305D. Further, on the fourth contact region of an upper portion of the gate pad, the first insulating interlayer 310 remains.

Referring to FIG. 11B, if a dry etching process is performed using fluorine-based gas in a state that the third contact hole 316c is formed, a surface of the metallic data line 312 is passivated, so that the data line 312 is not etched any more or the etching process is performed slowly. Meanwhile, the first insulating interlayer 310 and the gate insulating layer 306 of oxide or nitride is continuously etched. Therefore, the first, second, third and fourth contact regions are completely opened to form the first contact hole 316a, the second contact hole 316b and the fourth contact hole (not shown).

Therefore, in case the second insulating interlayer 315 is made of the photosensitive organic insulating material, the contact holes respectively having different depths are formed using a single photolithography process.

Here, on an upper face of the second insulating interlayer 315 made of the photosensitive organic material, there is formed an embossed portion by an exposure process in which light amount is partially controlled. A pixel electrode of a reflective material is formed thereon. The embossed portion serves as a micro-lens, thereby providing a reflective LCD in which image quality such as a visual angle is improved.

Embodiment 6

FIGS. 12A, 12B, 12C and 12D are cross-sectional views illustrating a method of manufacturing a polycrystalline silicon TFT according to the sixth embodiment of the present invention.

Figure 12A:
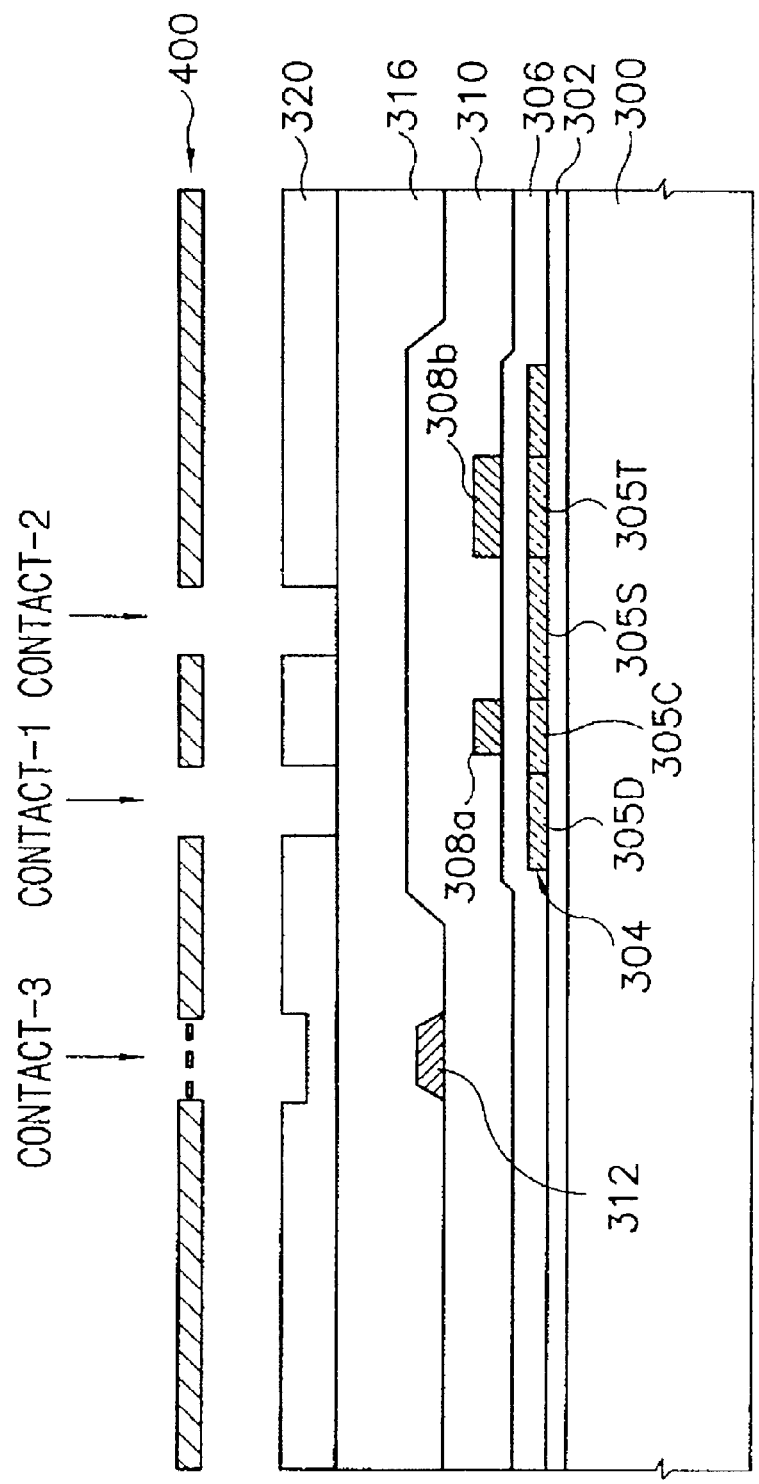
FIGS. 12A, 12B, 12C and 12D are cross-sectional views illustrating a method of manufacturing a polycrystalline silicon TFT according to the sixth embodiment of the present invention.

Referring to FIG. 12A, on a transparent substrate 100, there are formed a gate line including a gate electrode 308a, a gate line and a gate pad, and a capacitor line in the same manner as in Embodiment 4. On the gate line, the capacitor line and the gate insulating layer 106, there is deposited an inorganic insulating material made of silicon dioxide (SiO2), silicon nitride (SiNx) or a combination thereof and thus the first insulating interlayer 310 is formed. Afterwards, there is formed the second insulating interlayer 316 which is made of organic insulating material or inorganic insulating material on the first insulating interlayer 310 and the data line 312.

After a photoresist film is coated on the second insulating interlayer 316, the photoresist film is exposed and developed using a mask 400 having both of a slit pattern and a full exposure pattern and a half-tone mask in order to lower the exposure intensity through the refraction. Thus, there is formed the first photoresist pattern 320, which has the first thickness at the third contact region on the data line 312, which is in a completely removed state at the second contact region and first contact region and which has the second thickness thicker than the first thickness at the remaining region.

Figure 12B:
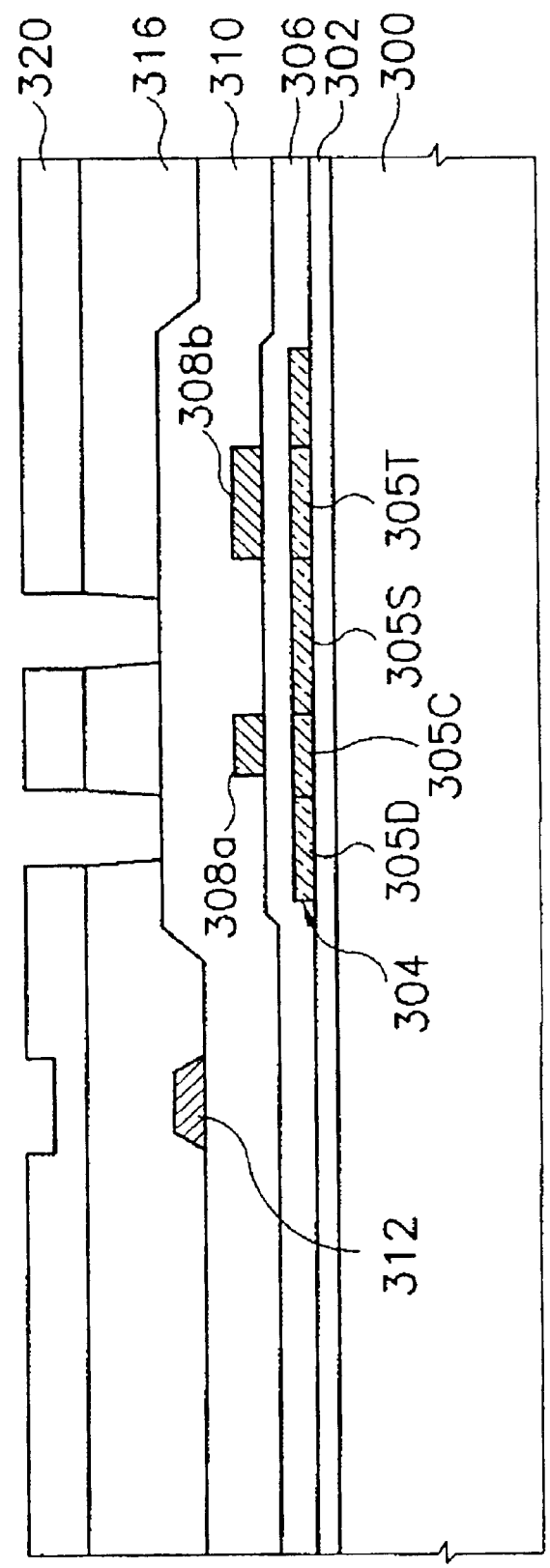

Referring to FIG. 12B, the second insulating interlayer 316 is etched using the first photoresist pattern 320 as an etch mask. Then, the second insulating interlayer 316 is completely removed at the first contact region and second contact region but remains at the third contact region.

Figure 12C:
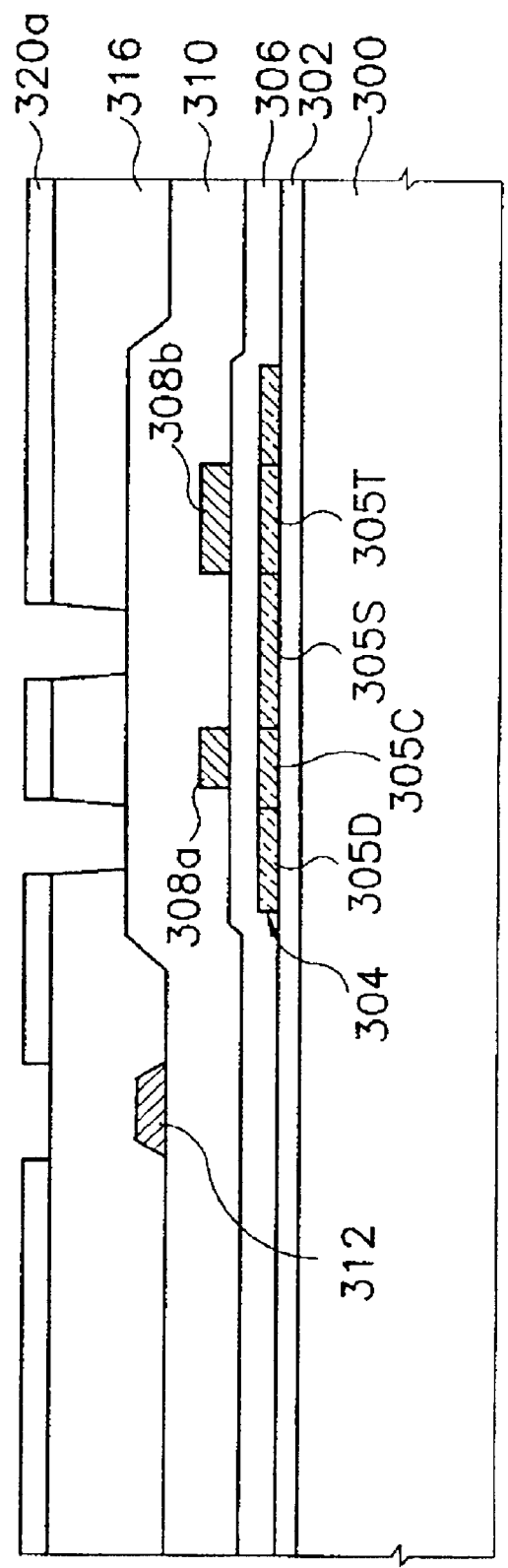

Referring to FIG. 12C, the first photoresist pattern 320 is etched back to form the second photoresist pattern 320a having a uniform thickness.

Figure 12D:
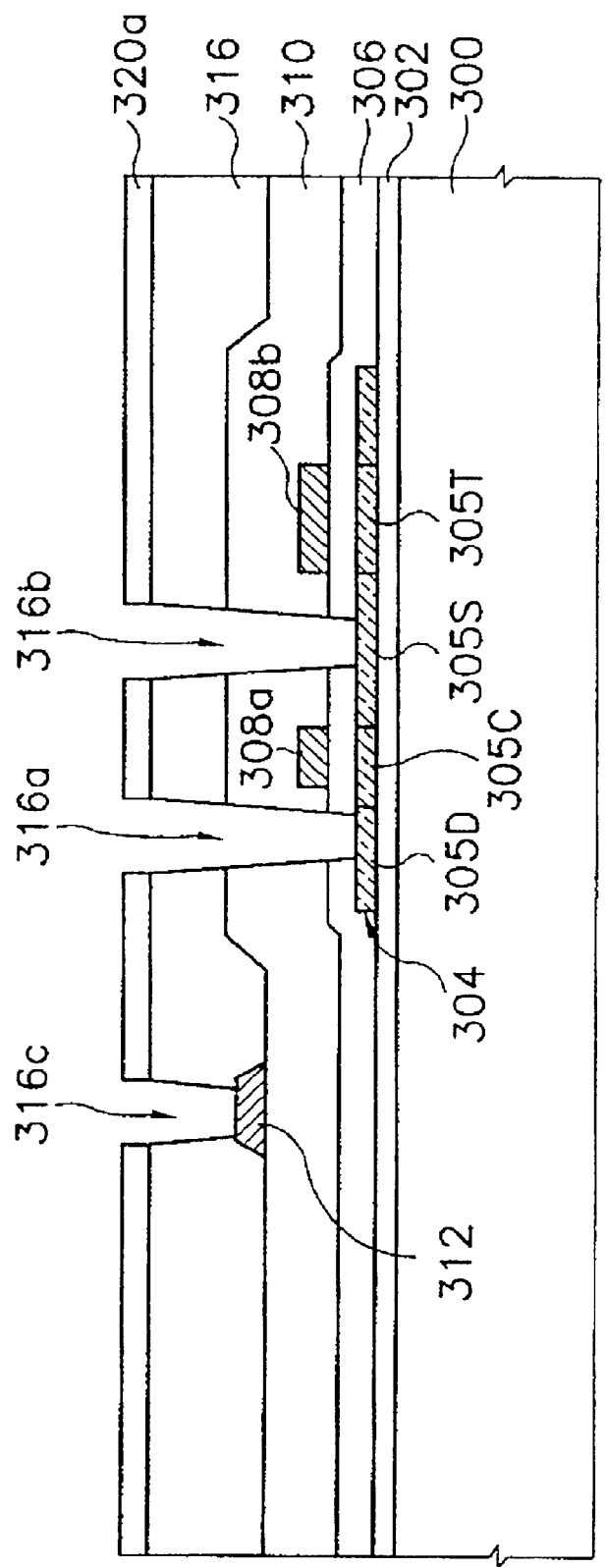

Referring to FIG. 12D, the exposed second insulating interlayer 316, the first insulating interlayer 310 and the gate insulating layer 306 are dry-etched using the second photoresist pattern 320a as an etch mask. Then, there are formed the first contact hole 316a for exposing drain region 305D of active pattern 304, the second contact hole 316b for exposing source region 305S and the third contact hole 316c for exposing data line 312 at the same time.

Subsequently, although not shown in the drawings, the second photoresist pattern 320a is removed by an ashing and strip process. Afterwards, a conductive film is deposited on the contact holes 316a, 316b and 316c and the second insulating interlayer 316 and then patterned using a photolithography process to form a drain electrode 318a and a pixel electrode 318b as shown in FIG. 9.

According to the first embodiment of the present invention, a data line and a pixel electrode capable of being made of the same material are formed from the same layer. Contact holes for respectively connecting the data line and the pixel electrode to a source region and a drain region of an active pattern are formed at the same time. That is, an image signal is transmitted to the drain region through the data line formed from the same layer as in the pixel electrode. Further, the pixel electrode is directly connected to the source region of a TFT without a separate source electrode. Therefore, the number of used mask is reduced from 7 sheets to 5 sheets, thereby simplifying a manufacturing process.

According to the second embodiment of the present invention, in order to prevent the data line and the pixel electrode formed from the same layer, as described in the first embodiment, from being exposed to an outside, a passivation layer is formed on the data line and the pixel electrode. At this time, since the passivation layer of a pad region is removed, a mask for patterning the passivation layer is further necessary when compared with the first embodiment.

According to the third embodiment of the present invention, after developing the insulating interlayer made of organic insulating material, the surface of the insulting interlayer is protected by the photoresist pattern in order to prevent a surface damage of the insulating interlayer due to high density plasma generated during the dry etching of the gate insulating layer. That is, since the gate insulating layer is etched in such a state that the surface of the insulating interlayer is not exposed, a surface damage of the insulating interlayer can be prevented.

According to the fourth embodiment of the present invention, after forming the data line, contact holes are formed at the same time. An electrode connected with the pixel electrode and the data line is formed from the same layer. That is, the image signal applied to the data line is transmitted to the drain region of the TFT through the drain electrode formed from the same layer as in the pixel electrode. Further, the pixel electrode is directly connected to the source region of a TFT without a separate source electrode. Therefore, the number of used mask is reduced from 7 sheets to 6 sheets.

According to the fifth embodiment of the present invention, in case the second insulating interlayer for insulating the data line and the pixel electrode is made of an acrylic photosensitive organic material, after patterning the second insulating interlayer through a developing process during an exposure process without a separate etching process, the contact holes for exposing the data line and the source/drain region is formed by a single photolithography process using a etching property difference between an oxide layer (or a nitride layer) and a metal layer in a dry etching process using fluorine-based gas.

According to the sixth embodiment of the present invention, it is possible to concurrently form contact holes having different depths using a slit mask or half-tone mask.

Therefore, according to a method of manufacturing the TFT for an LCD of the present invention, the number of mask is reduced comparing with a conventional method, thereby simplifying the manufacturing process.

While the present invention has been described in detail, it should be understood that various changes, substitutions and alterations can be made hereto without departing from the spirit and scope of the invention as defined by the appended claims.

What is claimed is:

1. A thin film transistor (TFT) comprising:
   an active pattern formed of polycrystalline silicon on a substrate and comprising a first impurity region, a second impurity region and a channel region;
   a gate insulating layer formed over the substrate and the active pattern;
   a gate line formed on the gate insulating layer, overlapping the active pattern, and including a gate electrode;
   an insulating layer formed on the gate insulating layer and the gate line;
   a data line formed on the insulating layer and connected to the second impurity region through a first contact hole extending through the gate insulating layer and the insulating layer; and
   a pixel electrode formed of the same material with the data line on the insulating layer and connected to the first impurity region through a second contact hole extending through the gate insulating layer and the insulating layer.

2. The TFT of claim 1, further comprising a capacitor line formed of the same layer with the gate line, overlapping the first impurity region and extending in parallel with the gate line.

3. The TFT of claim 1, further comprising a signal transmission line formed of the same layer with in the gate line, extending in a direction perpendicular to the gate line, and spaced apart from the gate line and connected to the data line through a third contact hole extending through the insulating layer.

4. The TFT of claim 1, further comprising a blocking layer formed between the substrate and the active pattern.

5. The TFT of claim 1, further comprising a passivation layer formed over the insulating layer, the data line and the pixel electrode.

6. The TFT of claim 1, wherein the insulating layer comprises an inorganic insulating material.

7. The TFT of claim 1, wherein the insulating layer comprises an organic insulating material.

8. The TFT of claim 7, wherein the insulating layer has an embossed surface.

9. The TFT of claim 1, wherein the insulating layer is comprised of an organic insulating material.

10. The TFT of claim 9, wherein the insulating layer has an embossed surface.

11. A polycrystalline silicon TFT for an LCD, comprising:
    an active pattern formed on a substrate;
    a gate insulating layer formed on the substrate including the active pattern;
    a gate line formed on the gate insulating layer to cross the active pattern, said gate line including a gate electrode for defining a first impurity region, a second impurity region and a channel region;
    a first insulating layer formed on the gate insulating layer including the gate line;
    a data line formed on the first insulating layer;
    a second insulating layer formed on the first insulating layer including the data line;
    a pixel electrode formed at the second insulating layer and connected with the first impurity region through a second contact hole which is formed through the gate insulating layer, the first insulating layer and the second insulating layer on the first impurity region; and
    an electrode formed on the second insulating layer and formed from a same layer as in the pixel electrode, the electrode connecting the data line and the second impurity region through a first contact hole which is formed through the gate insulating layer and the first and second insulating layers on the second impurity region and a third contact hole which is formed at the second insulating layer on the data line.

12. The TFT of claim 11, further comprising a capacitor line formed on the gate insulating layer and formed from the same layer as in the gate line, the capacitor line being overlapped with the first impurity region and in parallel with the gate line.

13. The TFT of claim 11, wherein the first and second insulating layers comprise an inorganic insulating material.

14. The TFT of claim 11, wherein the first and second insulating layers comprise an acrylic photosensitive organic insulating material.

15. The TFT of claim 14, wherein the second insulating layer has an embossed surface.

16. A method of manufacturing a thin film transistor (TFT), comprising steps of:
- forming an active pattern on a substrate;
- forming a gate insulating layer on the substrate including the active pattern;
- forming a gate layer on the gate insulating layer;
- patterning the gate layer to form a gate line;
- performing an ion-implanting process to form a first impurity region and a second impurity region in the active pattern;
- forming an insulating layer over the gate insulating layer and the gate line;
- partially etching the insulating layer and the gate insulating layer to form a first contact hole for exposing the second impurity region and a second contact hole for exposing the first impurity region;
- forming a conductive layer on the insulating layer including the first and second contact holes; and
- patterning the conductive layer to form a data line connected through the first contact hole to the second impurity region and a pixel electrode connected through the second contact hole to the first impurity region.

17. The method of claim 16, further comprising a step of forming a blocking layer on an entire surface of the substrate prior to the step of forming the active pattern.

18. The method of claim 17, wherein the step of forming the first and second contact holes comprises the steps of:
- forming a photoresist pattern for defining contact hole regions on the insulating layer;
- developing the insulating layer using the photoresist pattern as a mask to remove the insulating layer of the contact hole regions;
- etching the gate insulating layer using the photoresist pattern as an etch mask to form the first contact hole and the second contact hole; and
- removing the photoresist pattern.

19. The method of claim 16, wherein the step of forming the gate line comprises the steps of:
- forming a first gate electrode on a first conductive type transistor region and then implanting a second conductive type impurity ion; and
- forming a second gate electrode on a second conductive type transistor region and then implanting a first conductive type impurity ion.

20. The method of claim 16, wherein the step of patterning the gate layer comprises a step of forming a signal transmission line extending in a direction perpendicular to the gate line along with the gate line and spaced apart from the gate.

21. The method of claim 20, wherein the step of etching the insulating layer comprises a step of forming a third contact hole exposing the signal transmission line along with the first and second contact holes.

22. The method of claim 21, wherein the data line connects the signal transmission line and the second impurity region through the first and third contact holes.

23. The method of claim 16, wherein the insulating layer comprises an organic insulating material or an inorganic insulating material.

24. The method of claim 16, further comprising a step of performing an exposing and developing process to form an embossed portion on a surface of the insulating layer.

25. A method of manufacturing a polycrystalline silicon TFT for an LCD, comprising steps of:
- forming an active pattern on a substrate;
- forming a gate insulating layer on the substrate including the active pattern;
- forming a gate layer on the gate insulating layer;
- patterning the gate layer to form a gate line and performing an ion-implanting process to form a first impurity region and a second impurity region at the active pattern;
- forming a first insulating layer on the insulating layer including the gate line;
- forming a data line on the first insulating layer;
- forming a second insulating layer on the first insulating layer including the data line;
- partially etching the second insulating layer, the first insulating layer or the gate insulating layer to form a first contact hole for exposing the second impurity region, a second contact hole for exposing the first impurity region and a third contact hole for exposing the data line;
- forming a conductive layer on the second insulating layer; and
- patterning the conductive layer to form an electrode which connects the data line and the second impurity region through the first and third contact holes, and a pixel electrode which is connected through the second contact hole to the first impurity region.

26. The method of claim 25, wherein the step of forming the first, second and third contact holes is performed by a dry etching process using a fluorine-based gas.

27. The method of claim 25, wherein the step of forming the first, second and third contact holes is performed using a slit mask or a half-tone mask.

28. The method of claim 27, wherein the step of forming the first, second and third contact holes comprises the steps of:
- coating a photoresist film on the second insulating layer;
- exposing and developing the photoresist film using a mask having a full-exposure pattern and a slit pattern to form a first photoresist pattern, said first photoresist pattern having a first thickness at the third contact, being in a state that said first photoresist pattern is completely removed, and having a second thickness thicker than the first thickness;
- etching the second insulating layer using the first photoresist pattern;
- etching back the first photoresist pattern to form a second photoresist pattern having a uniform thickness;
- etching the second insulating layer, the first insulating layer and the gate insulating layer using the second photoresist pattern to form the first, second and third contact holes; and
- removing the second photoresist pattern.

29. The method of claim 25, wherein the second insulating layer comprises an acrylic photosensitive organic insulating material.

30. The method of claim 29, further comprising a step of performing an exposing and developing process to form an embossed portion at a surface of the second insulating layer during the step of forming the second insulating layer.

31. A thin film transistor (TFT), comprising:
- an active pattern formed of polycrystalline silicon on a substrate and including a first impurity region, a second impurity region and a channel region;

a gate insulating layer formed over the substrate and the active pattern;

a gate line formed on the gate insulating layer and including a gate electrode overlapping the active pattern;

an insulating layer formed over the gate insulating and the gate line;

a data line formed on the insulating layer and connected to the second impurity region through a first contact hole extending through the gate insulating layer and the insulating layer;

a pixel electrode formed of the same layer with the data line and connected to the first impurity region through a second contact hole extending through the gate insulating layer and the insulating layer; and a capacitor line formed of the same layer with the gate line and overlapping the first impurity region.

32. The TFT of claim 31, further comprising a signal transmission line formed of the same layer with the gate line, spaced apart from the gate line and extending in a direction perpendicular to the gate line and connected to the data line through a third contact hole extending through the insulating layer.

33. The TFT of claim 31, further comprising a blocking layer formed between the substrate and the active pattern.

* * * * *